US012598899B2

(12) United States Patent
Shin et al.

(10) Patent No.: US 12,598,899 B2
(45) Date of Patent: Apr. 7, 2026

(54) DISPLAY DEVICE AND METHOD OF FABRICATING THE SAME

(71) Applicant: Samsung Display Co., LTD., Yongin-si (KR)

(72) Inventors: Hyun Eok Shin, Yongin-si (KR); Joon Yong Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 431 days.

(21) Appl. No.: 18/222,348

(22) Filed: Jul. 14, 2023

(65) Prior Publication Data

US 2024/0147820 A1 May 2, 2024

(30) Foreign Application Priority Data

Nov. 2, 2022 (KR) ........................ 10-2022-0144703

(51) Int. Cl.
*H10K 59/80* (2023.01)
*H10K 59/40* (2023.01)
(Continued)

(52) U.S. Cl.
CPC ......... *H10K 59/8792* (2023.02); *H10K 59/40* (2023.02); *H10K 59/873* (2023.02);
(Continued)

(58) Field of Classification Search
CPC .............. H10K 59/878; H10K 59/8791; G02F 1/133504; G02B 5/003; G02B 5/201; G02B 5/045; G06F 3/0446
See application file for complete search history.

(56) References Cited

U.S. PATENT DOCUMENTS

2014/0117330 A1* 5/2014 Cho ................... H10K 59/8791
257/40
2016/0013259 A1* 1/2016 Yang ................... H10K 59/126
257/40
(Continued)

FOREIGN PATENT DOCUMENTS

CN 101409330 A 4/2009
KR 10-2003-0058787 A 7/2003
(Continued)

OTHER PUBLICATIONS

International Search Report, mailed Nov. 6, 2023, corresponding to PCT/KR2023/011054, 3 pages.

*Primary Examiner* — Alia Sabur
(74) *Attorney, Agent, or Firm* — Womble Bond Dickinson (US) LLP

(57) ABSTRACT

A display device includes: a display panel having a display area and a non-display area; and a viewing angle control layer in the display area. The viewing angle control layer includes a plurality of viewing angle control patterns spaced apart from one another, and each of the viewing angle control patterns includes a transparent insulating pattern and a multi-layer sidewall on a side surface of the transparent insulating pattern. The multi-layer sidewall includes a first metal nitride layer, a second metal nitride layer, and a metal layer between the first metal nitride layer and the second metal nitride layer, and the first metal nitride layer, the second metal nitride layer, and the metal layer each includes Al or Ti.

21 Claims, 18 Drawing Sheets

(51) Int. Cl.
    *H10K 71/20*         (2023.01)
    *H10K 102/00*      (2023.01)

(52) U.S. Cl.
    CPC ......... *H10K 71/231* (2023.02); *H10K 59/875*
        (2023.02); *H10K 2102/351* (2023.02)

(56)            References Cited

U.S. PATENT DOCUMENTS

| | | | |
|---|---|---|---|
| 2020/0403181 A1* | 12/2020 | Jung | H10K 59/87 |
| 2021/0013455 A1* | 1/2021 | Bae | H10K 59/8792 |
| 2023/0393312 A1* | 12/2023 | Kenney | G09F 21/049 |

FOREIGN PATENT DOCUMENTS

| | | |
|---|---|---|
| KR | 10-2008-0057652 A | 6/2008 |
| KR | 10-2013-0005409 A | 1/2013 |
| KR | 10-2022-0004262 A | 1/2022 |
| WO | WO 2006/030823 A1 | 3/2006 |

\* cited by examiner

FIG. 12

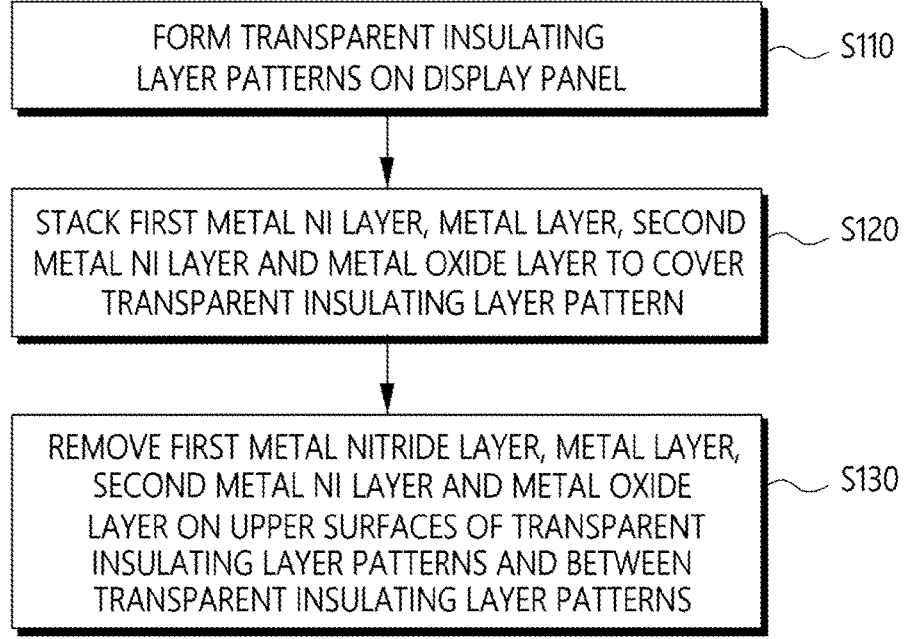

FORM TRANSPARENT INSULATING
LAYER PATTERNS ON DISPLAY PANEL — S110

STACK FIRST METAL NI LAYER, METAL LAYER, SECOND
METAL NI LAYER AND METAL OXIDE LAYER TO COVER
TRANSPARENT INSULATING LAYER PATTERN — S120

REMOVE FIRST METAL NITRIDE LAYER, METAL LAYER,
SECOND METAL NI LAYER AND METAL OXIDE
LAYER ON UPPER SURFACES OF TRANSPARENT
INSULATING LAYER PATTERNS AND BETWEEN
TRANSPARENT INSULATING LAYER PATTERNS — S130

FIG. 13

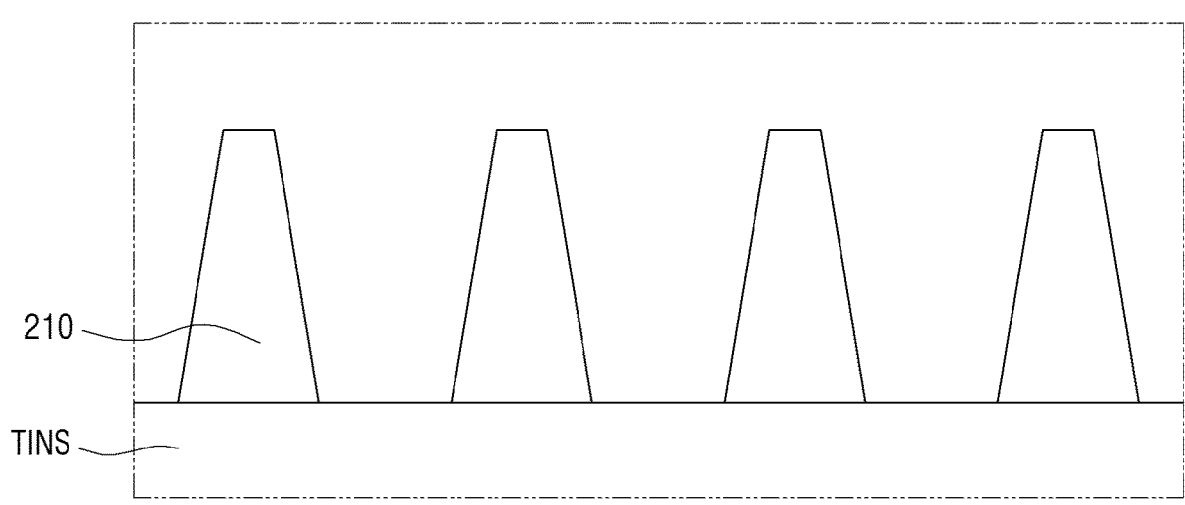

210

TINS 223
222
221
210

TINS 224
223
222
221
210

TINS

DISPLAY DEVICE AND METHOD OF FABRICATING THE SAME

CROSS-REFERENCE TO RELATED APPLICATION

This application claims priority to and the benefit of Korean Patent Application No. 10-2022-0144703, filed on Nov. 2, 2022, in the Korean Intellectual Property Office, the entire disclosure of which is incorporated herein by reference.

BACKGROUND

1. Field

Aspects of embodiments of the present disclosure relate to a display device and a method for fabricating the same.

2. Description of the Related Art

Display devices are becoming more and more important as multimedia technology evolves. Accordingly, a variety of types of display devices, such as liquid-crystal display (LCD) devices and organic light-emitting diode (OLED) display devices (also called an organic light-emitting display device) are currently used.

From among the various types of display devices, an organic light-emitting display device displays images by using an organic light-emitting device that emits light as electrons and holes recombine. Such a display device has certain advantages, such as a fast response speed, high luminance, and wide viewing angle and requires relatively low power to be driven.

A display device displays image information to a user. Typically, display devices are developed to have a wide viewing angle to allow a user to see images on the display devices from different angular directions. However, wide viewing angles may adversely affect (or may be an undesirable feature for) some display devices depending on their purposes. In other words, some display devices desirably have a narrow viewing angle.

For example, if a display device for a vehicle navigation system has a wide viewing angle, light may be reflected on the windshield of the vehicle during night driving, which may adversely affect the driver's view and safe driving. In addition, if a display device for a computer or a mobile phone has a wide viewing angle, passersby may be able to easily view the displayed information, which is not desired by the user.

SUMMARY

Embodiments of the present disclosure provide a display device that provides privacy protection features by preventing (or removing) side light and a method of fabricating the same.

However, aspects and features of the present disclosure are not limited to those set forth herein. The above and other aspects and features of the present disclosure will become more apparent to one of ordinary skill in the art to which the present disclosure pertains by referencing the detailed description of the present disclosure given below.

According to an embodiment of the present disclosure, a display device includes a display panel having a display area and a non-display area and a viewing angle control layer. The viewing angle control layer includes a plurality of viewing angle control patterns spaced apart from one another in the display area. Each of the viewing angle control patterns includes a transparent insulating pattern and a multi-layer sidewall on a side surface of the transparent insulating pattern. The multi-layer sidewall includes a first metal nitride layer, a second metal nitride layer, and a metal layer between the first metal nitride layer and the second metal nitride layer, and the first metal nitride layer, the second metal nitride layer, and the metal layer each includes Al or Ti.

The first metal nitride layer, the second metal nitride layer, and the metal layer may include a same metal.

The multi-layer sidewall may further include a metal oxide layer.

The first metal nitride layer, the metal layer, the second metal nitride layer and the metal oxide layer may be sequentially stacked on the transparent insulating pattern.

A height of the viewing angle control patterns may have a same ratio as a distance from a central axis of a first one of the viewing angle control patterns to a center axis of an adjacent second one of the viewing angle control patterns.

A thickness of the first metal nitride layer may be equal to a thickness of the second metal nitride layer, and a thickness of the metal layer may be greater than the thickness of the first metal nitride layer.

The multi-layer sidewall may further include a metal oxide layer, and the metal oxide layer may be thinner than the first metal nitride layer.

The transparent insulating pattern may have a cross-sectional shape of an isosceles trapezoid having a longer base side, and base angles of the isosceles trapezoid may be in a range from 60 degrees to 89.5 degrees.

The display panel may include a substrate, an emission material layer on the substrate and including a pixel and a pixel-defining layer defining the pixel, and a thin-film encapsulation layer. The pixel may include a pixel electrode, an emissive layer, and a common electrode, the viewing angle control layer may be on the thin-film encapsulation layer, and the thin-film encapsulation layer may be on the emission material layer.

A ratio of a width of the viewing angle control patterns to a width of the emissive layer may be in a range from 1:3 to 1:4.

The display device may further include a touch sensing layer between the thin-film encapsulation layer and the viewing angle control layer.

The touch sensing layer may include a touch electrode, and at least a part of the viewing angle control pattern may overlap with the touch electrode.

The display device may further include a touch sensing layer on the viewing angle control layer.

According to an embodiment of the present disclosure, a display device includes a display panel having a display area and a non-display area and a viewing angle control layer. The viewing angle control layer includes a plurality of viewing angle control patterns spaced apart from one another in the display area. Each of the viewing angle control patterns includes a transparent insulating pattern and a multi-layered sidewall on a side surface of the transparent insulating pattern. The multi-layer sidewall includes a first metal nitride layer, a second metal nitride layer, and a metal layer between the first metal nitride layer and the second metal nitride layer, and the first metal nitride layer, the metal layer, and the second metal nitride layer are AlN, Al, AlN, respectively, or TiN, Ti, TiN, respectively.

The multi-layer sidewall may further include a metal oxide layer formed of $Al_2O_3$ or $Ti_2O_3$.

A height of the viewing angle control patterns may have a same ratio as a distance from a central axis of a first one of the viewing angle control patterns to a center axis of an adjacent second one of the viewing angle control patterns.

The display panel may further include a plurality of pixels in the display area, and each of the pixel may include a pixel electrode, an emissive layer, and a common electrode. A ratio of a width of the pixels to a width of the viewing angle control patterns may be in a range from 1:3 to 1:4.

According to an embodiment, a method of fabricating a display device includes: forming a plurality of transparent insulating layer patterns spaced apart from one another at a uniform distance on a display panel; forming a light-absorbing layer by sequentially stacking a first metal nitride layer, a metal layer, and a second metal nitride layer on the display panel and covering the plurality of transparent insulating layer patterns; and etching the light-absorbing layer on upper surfaces of the plurality of transparent insulating layer patterns and between adjacent ones of the plurality of transparent insulating layer patterns by anisotropic etching. The first metal nitride layer, the second metal nitride layer, and the metal layer each include Al or Ti.

The forming of the light-absorbing layer may include stacking a metal oxide layer on the second metal nitride layer.

The first metal nitride layer, the metal layer, and the second metal nitride layer may be AlN, Al, and AlN, respectively, or TiN, Ti, and TiN, respectively.

The metal oxide layer may be $Al_2O_3$ or $Ti_2O_3$.

According to embodiments of the present disclosure, a display device having privacy protection features is provided by forming viewing angle control patterns that absorb light traveling toward the sides of an emission material layer.

However, aspects and features of the present disclosure are not limited to those described above, and various other aspects and features are included in the present specification.

BRIEF DESCRIPTION OF THE DRAWINGS

The above and other aspects and features of the present disclosure will become more apparent by describing, in detail, embodiments thereof with reference to the attached drawings, in which:

FIG. 12 is a flowchart describing steps of a method of fabricating a display device according to an embodiment of the present disclosure.

FIGS. 13 to 19 are cross-sectional views for illustrating the steps of the method of fabricating a display device described in FIG. 12.

DETAILED DESCRIPTION

Figure 1:
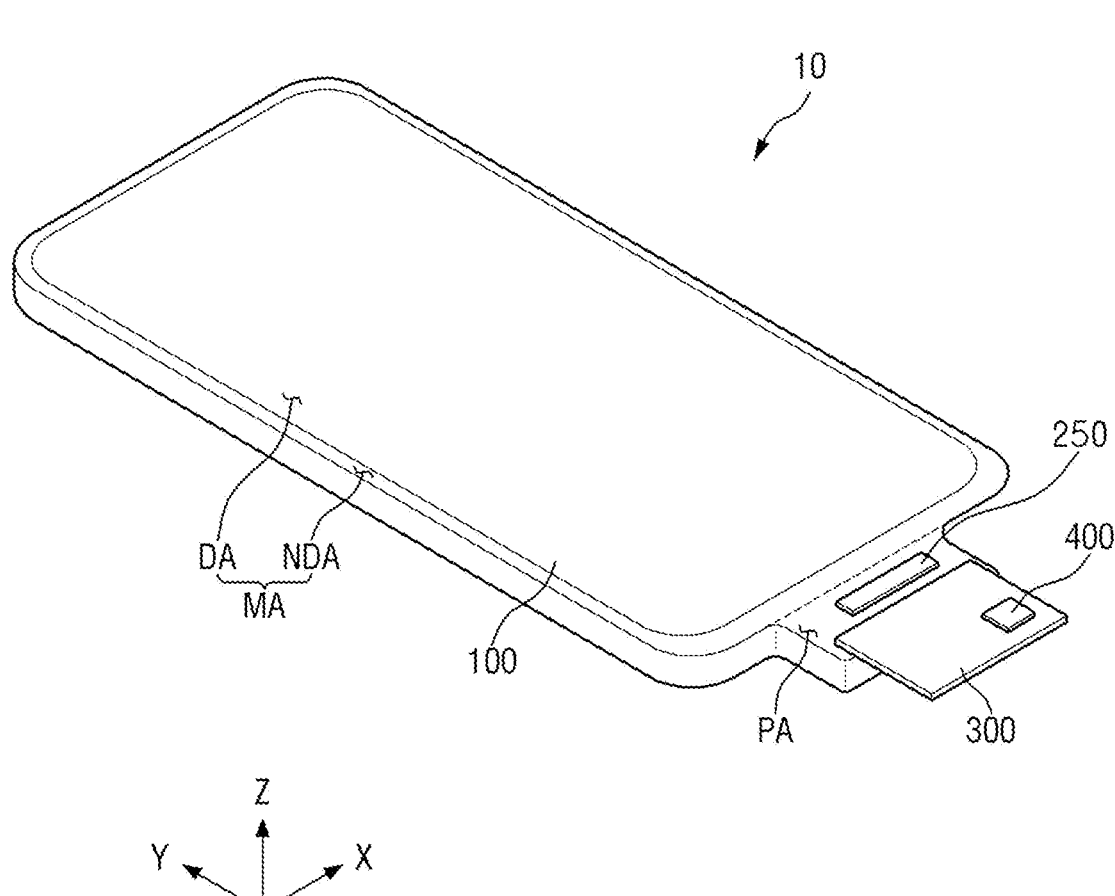
FIG. 1 is a perspective view of a display device according to an embodiment of the present disclosure.

The present disclosure will now be described more fully hereinafter with reference to the accompanying drawings, in which embodiments of the present disclosure are shown. The present disclosure may, however, be provided in different forms and should not be construed as being limited to the embodiments described herein. Some of the parts or features of the described embodiments that are not associated with or necessary for one of ordinary skill in the art to understand the present disclosure may not be described or included in the description of the embodiments of the present disclosure.

Further, the phrase "in a plan view" means when an object portion is viewed from above, and the phrase "in a schematic cross-sectional view" means when a schematic cross-section, taken by vertically cutting an object portion, is viewed from the side. The terms "overlap," "overlapping," or "overlapped" mean that a first object may be above or below or to a side of a second object, and vice versa. Additionally, the term "overlap" or variations thereof may include layer, stack, face or facing, extending over, covering, or partly covering or any other suitable term as would be appreciated and understood by those of ordinary skill in the art. The expression "not overlap" may include meanings such as "apart from" or "set aside from" or "offset from" and any other suitable equivalents as would be appreciated and understood by those of ordinary skill in the art. The terms "face" and "facing" may mean that a first object may directly or indirectly oppose a second object. When a third object is present between a first and second object, the first and second objects may be understood as being indirectly opposed to one another, although still facing each other.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of" and "any one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof. As used herein, the terms "use," "using," and "used" may be considered synonymous with the terms "utilize," "utilizing," and "utilized," respectively.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments of the present disclosure will be described in detail with reference to the accompanying drawings.

Figure 2:
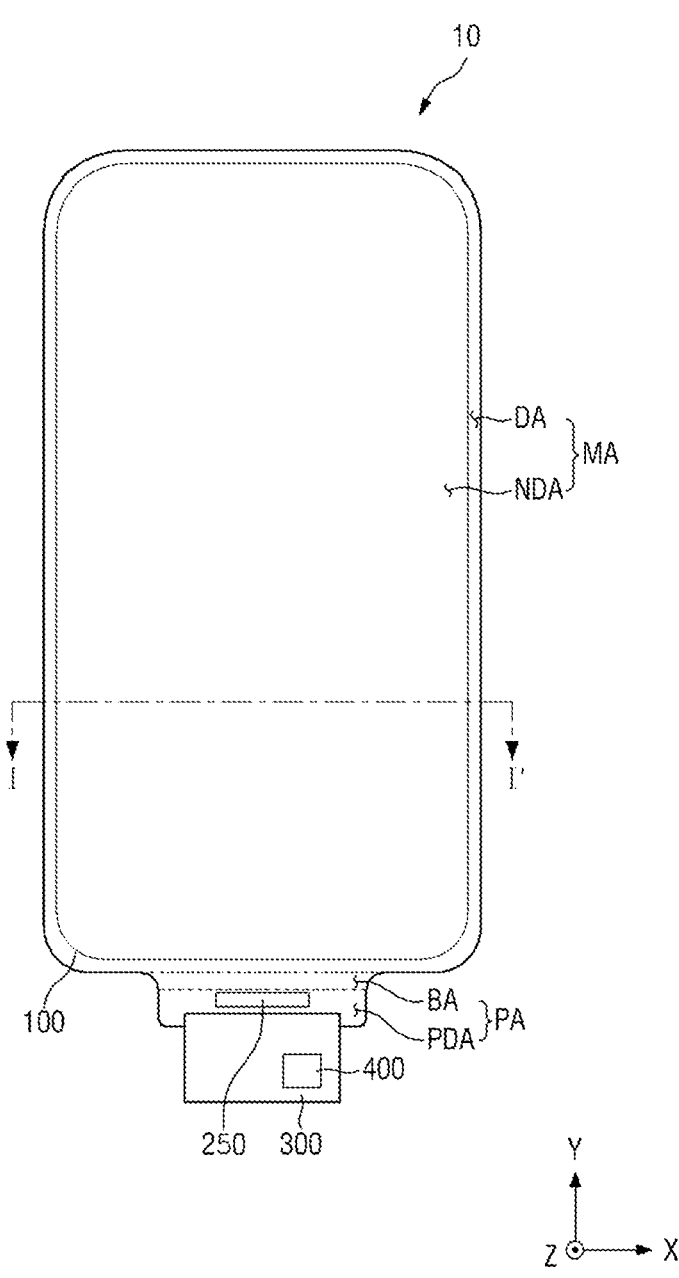
FIG. 2 is a plan view of a display device according to an embodiment of the present disclosure.

FIG. 1 is a perspective view of a display device according to an embodiment of the present disclosure. FIG. 2 is a plan view of the display device shown in FIG. 1 according to an embodiment of the present disclosure.

As used herein, the terms "above," "top," and "upper surface" refer to the upper side of the display panel 100 as indicated by the arrow in the z-axis direction, whereas the terms "below," "bottom," and "lower surface" refer to the lower side of the display panel 100 at the opposite side in the z-axis direction. As used herein, the terms "left," "right," "upper," and "lower" sides indicate relative positions when the display panel 100 is viewed from the top. For example, the "left side" refers to the opposite side of the arrow of the x-axis direction, the "right side" refers to the side indicated by the arrow of the x-axis direction, the "upper side" refers to the side indicated by the arrow of the y-axis direction, and the "lower side" refers to the opposite side of the arrow of the y-axis direction.

Referring to FIGS. 1 to 2, a display device 10 is for displaying moving images and/or still images is shown. The display device 10 may be used as the display screen of portable electronic devices, such as a mobile phone, a smart phone, a tablet PC, a smart watch, a watch phone, a mobile communications terminal, an electronic notebook, an electronic book, a portable multimedia player (PMP), a navigation device and an ultra-mobile PC (UMPC), as well as the display screen of various products, such as a television, a notebook, a monitor, a billboard and an Internet of Things (IoT) device. The display device 10 may be one of an organic light-emitting display device, a liquid-crystal display device, a plasma display device, a field emission display device, an electrophoretic display device, an electrowetting display device, a quantum dot light-emitting display device, a micro-LED display device, and the like. In the following description, the display device 10 is described as an organic light-emitting display device as an example. It is, however, to be understood that the present disclosure is not limited thereto.

According to an embodiment of the present disclosure, the display device 10 includes a display panel 100, a display driving circuit 250, a circuit board 300, and a touch driving circuit 400.

The display panel 100 may have a main area MA and a protruding area PA protruding from one side (e.g., one edge) of the main area MA.

The main area MA may have a rectangular plane shape having shorter sides in a first direction (e.g., the x-axis direction) and longer sides in a second direction (e.g., the y-axis direction) crossing (e.g., intersecting) the first direction (x-axis direction). Each of the corners at where the shorter sides in the first direction (x-axis direction) meet the longer sides in the second direction (y-axis direction) may be rounded with a curvature (e.g., a predetermined curvature) or may form a right angle. The shape of the display device 10, when viewed from the top, is not limited to a quadrangular shape and may have another polygonal shape, a circular shape, or an elliptical shape. The main area MA may be, but is not limited to being, flat. The main area MA may have curved portions formed at left and right ends (e.g., left and right sides) thereof. The curved portions may have a constant curvature or varying curvatures.

The main area MA may have a display area DA at where pixels are formed to display images and a non-display area NDA around (e.g., around a periphery of) the display area DA.

In addition to the pixels, scan lines, data lines, and power lines connected to the pixels may be disposed in the display area DA. When the main area MA has a curved portion, the display area DA may be disposed on the curved portion. In such an embodiment, the display panel 100 can also display images on the curved portion.

The non-display area NDA may be defined as the area from the outer side of the display area DA to the edge of the display panel 100. A scan driver for applying scan signals to scan lines and link lines connecting the data lines with the display driving circuit 250 may be disposed in the non-display area NDA.

The protruding area PA may protrude from one side of the main area MA. For example, the protruding area PA may protrude from the lower side of the main area MA as shown in FIGS. 1 and 2. The length of the protruding area PA in the first direction (x-axis direction) may be smaller than the length of the main area MA in the first direction (x-axis direction).

The protruding area PA may have a bending area BA and a pad area PDA. In such an embodiment, the pad area PDA may be disposed on one side of the bending area BA, and the main area MA may be disposed on the opposite side of the bending area BA. For example, the pad area PDA may be disposed on the lower side of the bending area BA, and the main area MA may be disposed on the upper side of the bending area BA.

The display panel 100 may be flexible so that it can be curved, bent, folded, or rolled. Therefore, the display panel 100 may be bent at the bending area BA in the thickness direction. In such an embodiment, the surface of the pad area PDA of the display panel 100 faces upwardly (e.g., in the z-axis direction) before the display panel 100 (e.g., before the bending area BA) is bent, and the surface of the pad area PDA of the display panel 100 faces downwardly (e.g., in the –z-axis direction) after the display panel 100 (e.g., after the bending area BA) is bent. As a result, because the pad area PDA is disposed under the main area MA, it may overlap the main area MA.

Pads electrically connected to the display driving circuit 250 and the circuit board 300 may be disposed in the pad area PDA of the display panel 100.

The display driving circuit 250 outputs signals and voltages for driving the display panel 100. For example, the display driving circuit 250 may apply data voltages to the data lines. In addition, the display driving circuit 250 may apply a supply voltage to the power line and may apply scan control signals to the scan driver. The display driving circuit 250 may be implemented as an integrated circuit (IC) and may be attached to the display panel 100 in a pad area PDA by a chip on glass (COG) technique, a chip on plastic (COP) technique, or an ultrasonic bonding technique. For example, the display driving circuit 250 may be mounted on the circuit board 300.

The pads may include display pads electrically connected to the display driving circuit 250 and touch pads electrically connected to touch lines.

The circuit board 300 may be attached to the pads by using an anisotropic conductive layer. In this manner, the lead lines of the circuit board 300 may be electrically connected to the pads. The circuit board 300 may be a flexible printed circuit board (FPCB), a printed circuit board (PCB), or a flexible film, such as a chip-on-film (COF).

The touch driving circuit 400 may be connected to touch electrodes of a touch sensor layer TSL of the display panel 100. The touch driving circuit 400 applies driving signals to the touch electrodes of the touch sensor layer TSL and measures capacitances of the touch electrodes. The driving signals may have driving pulses. The touch driving circuit 400 may not only determine whether or not a touch is input based on the measured capacitances but may also calculate touch coordinates of the position at where the touch is input.

The touch driving circuit 400 may be disposed on the circuit board 300. The touch driving circuit 400 may be implemented as an integrated circuit (IC) and may be mounted on the circuit board 300.

Figure 3:
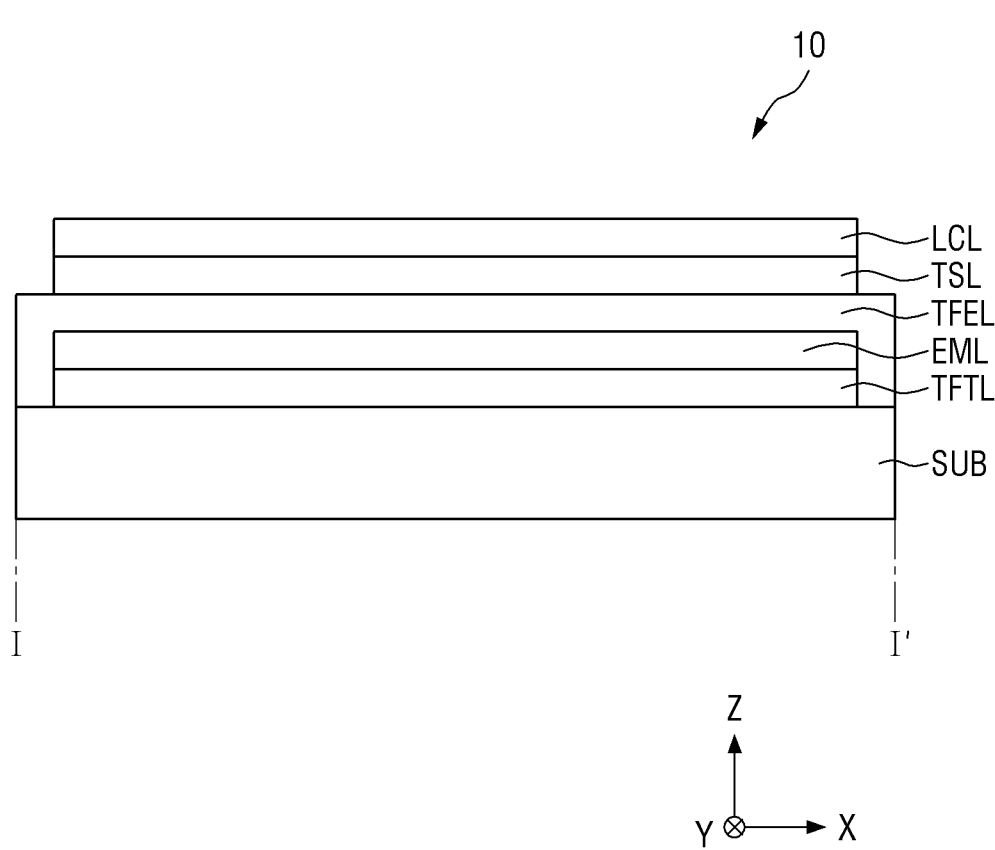
FIG. 3 is a cross-sectional view taken along the line I-I' of FIG. 2.

FIG. 3 is a schematic cross-sectional view taken along the line I-I' of FIG. 2.

Referring to FIG. 3, the display panel 100 may include a substrate SUB, a thin-film transistor layer TFTL disposed on the substrate SUB, an emission material layer EML, a thin-film encapsulation layer TFEL, a touch sensor layer TSL, and a viewing angle control layer LCL.

The substrate SUB may be made of an insulating material, such as glass, quartz, and a polymer resin. Examples of the polymer material may include polyether sulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or a combination thereof. In other embodiments, the substrate SUB may include a metallic material.

The substrate SUB may be a rigid substrate or a flexible substrate that is designed to be bent, folded, rolled, and so on. When the substrate SUB is a flexible substrate, it may be formed of, but is not limited to, polyimide (PI).

The thin-film transistor layer TFTL may be disposed on the substrate SUB. Scan lines, data lines, power supply lines, scan control lines, routing lines connecting the pads with the data lines as well as thin-film transistors in the pixels may be formed in the thin-film transistor layer TFTL. Each of the thin-film transistors may include a gate electrode, a semiconductor layer, a source electrode, and a drain electrode. When the scan driver 110 is formed in the non-display area NDA of the display panel 100 (see, e.g., FIG. 4), the scan driver 110 may include thin-film transistors.

The thin-film transistor layer TFTL may be disposed in the display area DA and the non-display area NDA. For example, the thin-film transistors in the pixels, the scan lines, the data lines, and the power supply lines in the thin-film film transistor layer TFTL may be disposed in the display area DA. The scan control lines and the link lines in the thin-film transistor layer TFTL may be disposed in the non-display area NDA.

The emission material layer EML may be disposed on the thin-film transistor layer TFTL. The light-emitting element layer EML may include pixels and a pixel-defining layer, and each pixel may include a first electrode, an emissive layer, and a second electrode. The emissive layer may be an organic emissive layer including (or containing) an organic material. The emissive layer may also include a hole transporting layer, an organic light-emitting layer, and an electron transporting layer. When a voltage is applied to the first electrode and a cathode voltage is applied to the second electrode through the thin-film transistor in the thin-film transistor layer TFTL, the holes and electrons move to the organic light-emitting layer through the hole transporting layer and the electron transporting layer, respectively, such that they combine in the organic light-emitting layer to emit light. The pixels in the emission material layer EML may be disposed in the display area DA.

The thin-film encapsulation layer TFEL may be disposed on the emission material layer EML. The thin-film encapsulation layer TFEL prevents oxygen or moisture from permeating into the emission material layer EML. To this end, the thin-film encapsulation layer TFEL may include at least one inorganic layer. The inorganic layer may be, but is not limited to, a silicon nitride layer, a silicon oxynitride layer, a silicon oxide layer, a titanium oxide layer, or an aluminum oxide layer. In addition, the thin-film encapsulation layer TFEL protects the emission material layer EML from foreign substances, such as dust. To this end, the thin-film encapsulation layer TFEL may include at least one organic layer. The organic layer may be formed of, but is not limited to, an acryl resin, an epoxy resin, a phenolic resin, a polyamide resin and a polyimide resin.

The thin-film encapsulation layer TFEL may be disposed in the display area DA as well as the non-display area NDA. For example, the thin-film encapsulation layer TFEL may cover the display area DA and the emission material layer EML and may cover the thin-film transistor layer TFTL in the non-display area NDA.

The touch sensor layer TSL may be disposed on the thin-film encapsulation layer TFEL. When the touch sensor layer TSL is disposed directly on the thin-film encapsulation layer TFEL, the thickness of the display device 10 can be reduced compared with a display device in which a separate touch panel including the touch sensor layer TSL is attached onto the thin-film encapsulation layer TFEL.

The touch sensor layer TSL may include touch electrodes for sensing a user's touch by, for example, capacitive sensing, and touch lines for connecting the pads with the touch electrodes. For example, the touch sensor layer TSL is configured to sense a user's touch by self-capacitance sensing or mutual capacitance sensing.

Figure 5:
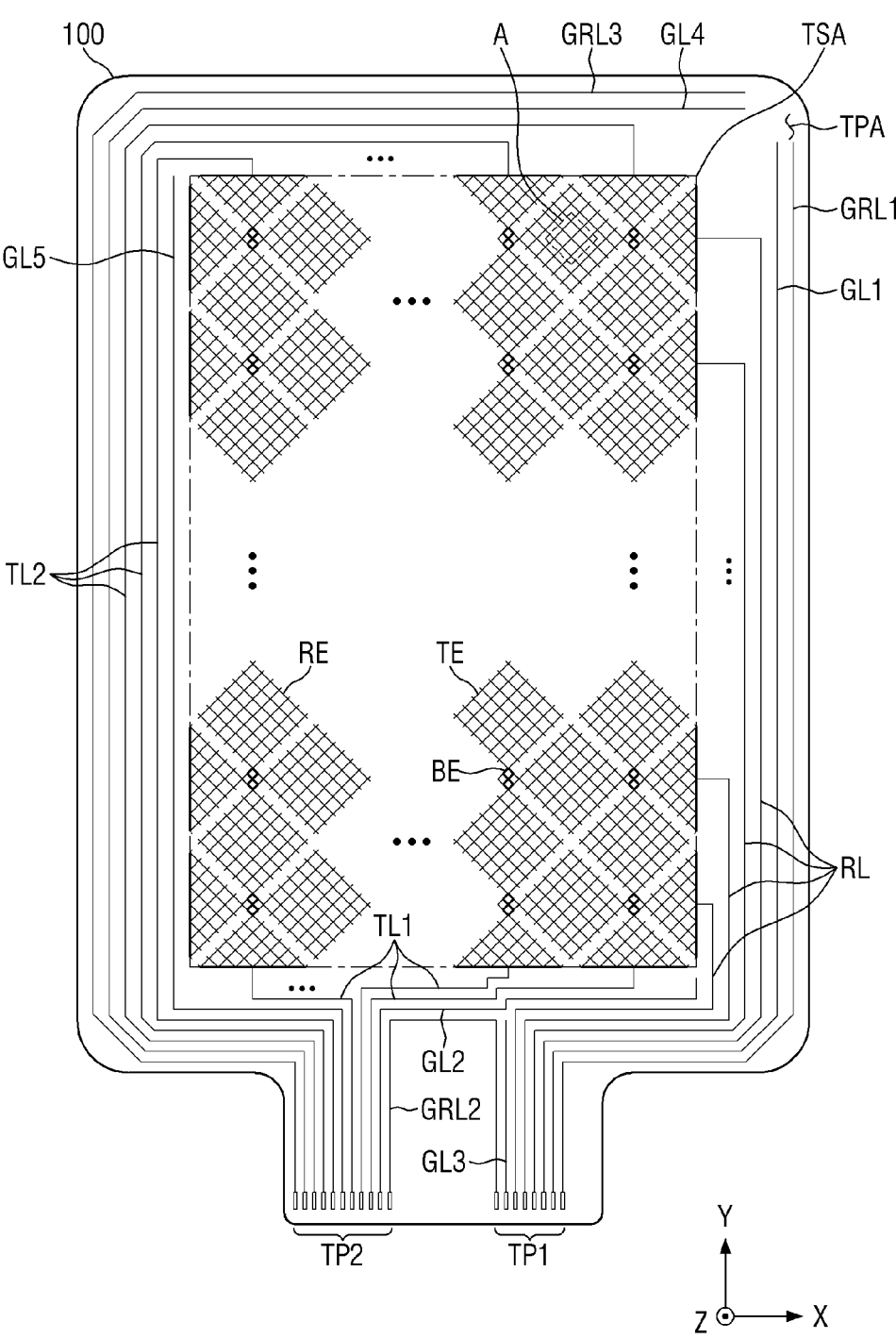
FIG. 5 is a view showing the touch sensor layer and the viewing angle control layer shown in FIG. 3.

The touch electrodes of the touch sensor layer TSL may be disposed in a touch sensor area TSA overlapping the display area DA (see, e.g., FIG. 5). The touch lines of the touch sensor layer TSL may be disposed in a touch peripheral area TPA overlapping the non-display area NDA (see, e.g., FIG. 5).

The viewing angle control layer LCL may be disposed on the touch sensor layer TSL. The viewing angle control layer LCL may be disposed such that it overlaps the display area DA. In addition, the viewing angle control layer LCL may be disposed such that it overlaps the touch sensor area TSA. The viewing angle control layer LCL absorbs some of the light that is emitted from the emission material layer EML and travels toward the sides of the display panel 100 rather than toward the upper side (in the z-axis direction).

A cover window may be further disposed on the viewing angle control layer LCL. In such an embodiment, the viewing angle control layer LCL and the cover window may be attached together by a transparent adhesive member, such as an optically clear adhesive (OCA) film.

Figure 4:
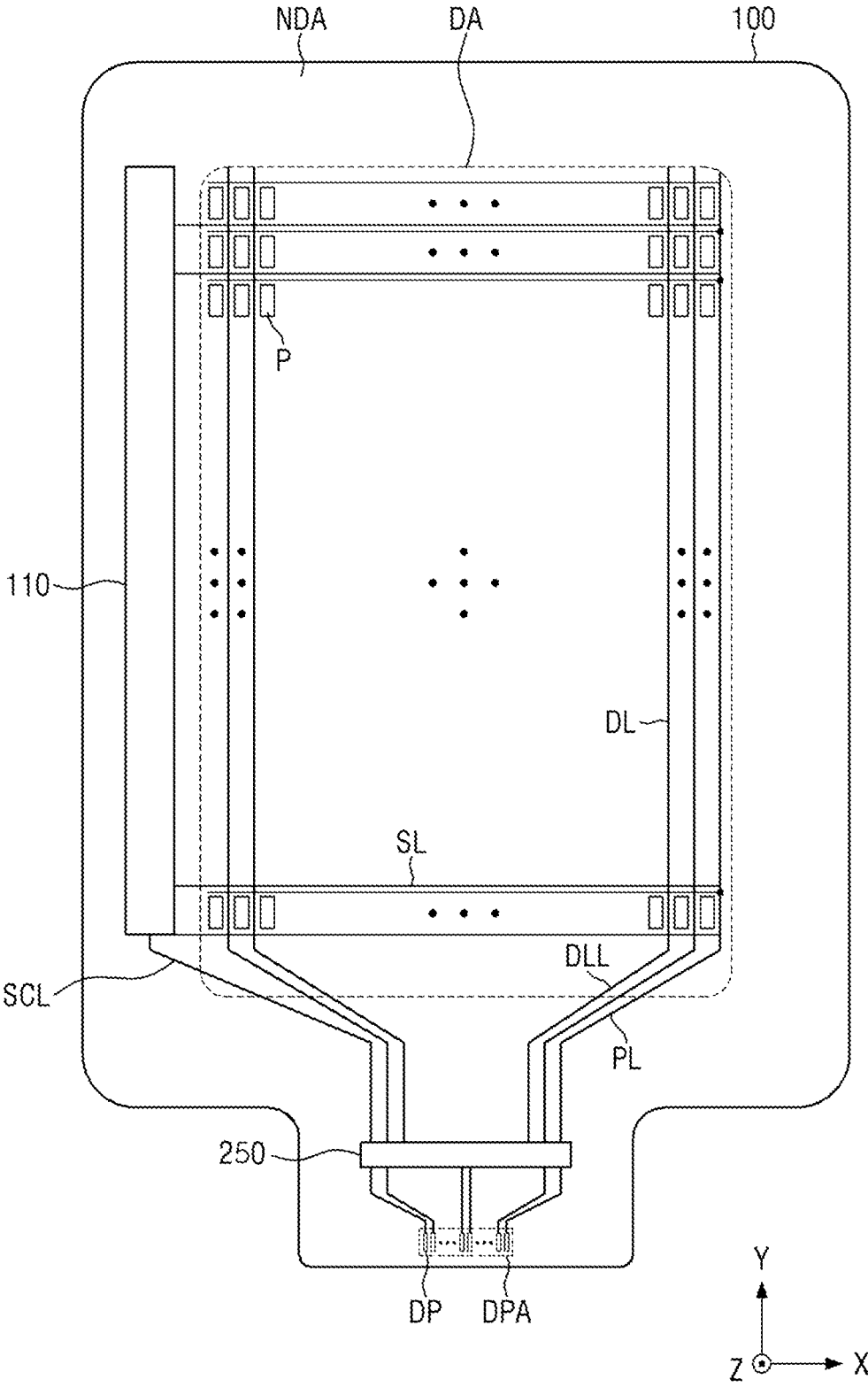
FIG. 4 is a detailed schematic view of the display unit shown in FIG. 3.

FIG. 4 is a view of the display panel shown in FIG. 3 in more detail.

For convenience of illustration, FIG. 4 shows only pixels P, scan lines SL, data lines DL, a power line PL, scan control lines SCL, a scan driver 110, a display driving circuit 250, and display pads DP of the display area DA.

Referring to FIG. 4, the scan lines SL, the data lines DL, the power line PL, and the pixels P are disposed within the display area DA. The scan lines SL may be arranged in the first direction (x-axis direction) and the data lines DL may be arranged in the second direction (y-axis direction) crossing (e.g., intersecting) the first direction (x-axis direction). The power lines PL may include at least one line in parallel with the data lines DL in the second direction (y-axis direction) and a plurality of lines branching off from the at least one line in the first direction (x-axis direction).

Each of the pixels P may be connected to at least one of the scan lines SL, one of the data lines DL, and the power line PL. Each of the pixels P may include thin-film transistors including a driving transistor and at least one switching transistor, an organic light-emitting diode, and a capacitor. When a scan signal is applied from the scan line SL, each of the pixels P receives a data voltage via the data line DL and supplies a driving current to the organic light-emitting diode according to the data voltage applied to the gate electrode so that light is emitted.

The scan driver 110 is connected to the display driving circuit 250 through at least one scan control line SCL. Accordingly, the scan driver 110 may receive the scan control signal from the display driving circuit 250. The scan driver 110 generates scan signals according to a scan control signal and supplies the scan signals to the scan lines SL.

Although the scan driver 110 is illustrated as being in the non-display area NDA on the left side of the display area DA in FIG. 4, the present disclosure is not limited thereto. For example, the scan driver 110 may be in the non-display area NDA on the left outer side as well as in the non-display area NDA on the right outer side of the display area DA.

The display driving circuit 250 is connected to the display pads DP and receives digital video data and timing signals. The display driving circuit 250 converts the digital video data into analog positive/negative data voltages and supplies them to the data lines DL through the link lines DLL. In addition, the display driving circuit 250 generates and supplies a scan control signal for controlling the scan driver 110 through the scan control line SCL. The pixels P to which the data voltages are to be supplied are selected by the scan signals of the scan driver 110, and the data voltages are supplied to the selected pixels P. The display driving circuit 250 may be implemented as an integrated circuit (IC) and may be attached to the substrate SUB by a chip on glass (COG) technique, a chip on plastic (COP) technique, or an ultrasonic bonding.

Figure 6:
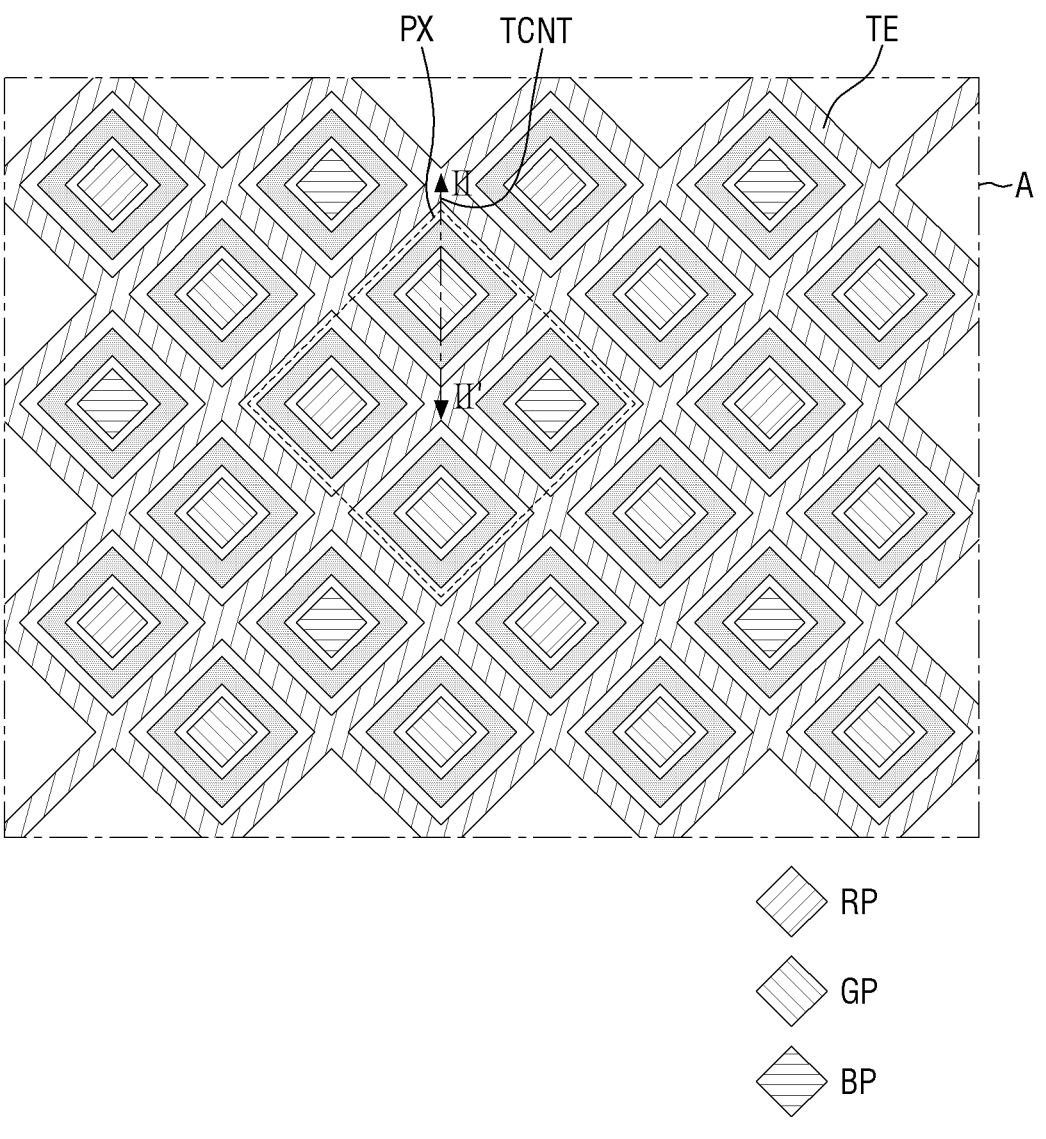
FIG. 6 is a plan view showing the sub-pixels shown in FIG. 4 and the first touch metal layer shown in FIG. 5.

FIG. 5 is a view showing, in detail, an example of the touch sensor layer and the viewing angle control layer shown in FIG. 3. FIG. 6 is a plan view showing an example of the sub-pixels shown in FIG. 4 and the first touch metal layer shown in FIG. 5.

For convenience of illustration, FIG. 5 shows only the touch electrodes TE and RE, the touch lines TL and RL, and the touch pads TP.

Referring to FIG. 5, the touch sensor layer TSL has the touch sensor area TSA for sensing a user's touch and the touch peripheral area TPA disposed around (e.g., around a periphery of) the touch sensor area TSA. The touch sensor area TSA may overlap the display area DA, and the touch peripheral area TPA may overlap the non-display area NDA.

The touch electrodes TE and RE may be disposed in the touch sensor area TSA. The touch electrodes TE and RE may include the sensing electrodes RE electrically connected with one another in the first direction (x-axis direction) and driving electrodes TE electrically connected with one another in the second direction (y-axis direction) crossing (e.g., intersecting) the first direction (x-axis direction). Although the sensing electrodes RE and the driving electrodes TE are illustrated as having a diamond-like shape when viewed from the top in FIG. 5, the present disclosure is not limited thereto.

To prevent a short-circuit between the sensing electrodes RE and the driving electrodes TE at where they cross each other, the driving electrodes TE adjacent to each other in the second direction (y-axis direction) may be electrically connected to each other via the connection electrode BE. In such an embodiment, the driving electrodes TE and the sensing electrodes RE may be disposed on one layer, while the connection electrodes BE may be disposed on a different layer from the driving electrodes TE and the sensing electrodes RE. The connection electrodes BE may be connected to the driving electrodes TE disposed on a different layer through touch contact holes (e.g., touch contact openings) TCNT (see, e.g., FIG. 21).

In addition, the sensing electrodes RE electrically connected with one another in the first direction (x-axis direction) and driving electrodes TE electrically connected with one another in the second direction (y-axis direction) are electrically insulated from one another.

The touch lines TL and RL may be disposed in the touch peripheral area TPA. The touch lines TL and RL may include sensing lines RL connected to the sensing electrodes RE and first driving lines TL1 and second driving lines TL2 connected to the driving electrodes TE.

The sensing electrodes RE disposed on the right side of the touch sensor area TSA may be connected to the sensing lines RL. For example, some of the sensing electrodes RE electrically connected in the first direction (x-axis direction) that are disposed at the right end may be connected to the sensing lines RL. The sensing lines RL may be connected to first touch pads TP1. Thus, the touch driving circuit 400 may be electrically connected to the sensing electrodes RE.

The driving electrodes TE disposed on the lower side of the touch sensor area TSA may be connected to the first driving lines TL1, while the driving electrodes TE disposed on the upper side of the touch sensor area TSA may be connected to the second driving lines TL2. For example, some (or all) of the driving electrodes TE electrically connected to one another in the second direction (y-axis direction) at the lowermost side may be connected to the first driving line TL1, while some (or all) of the driving electrodes TE disposed on the uppermost side may be connected to the second driving line TL2. The second driving lines TL2 may be connected to the driving electrodes TE at the upper side of the touch sensor area TSA via the left outer side of the touch sensor area TSA. The first driving lines TL1 and the second driving lines TL2 may be connected to the second touch pads TP2. Thus, the touch driving circuit 400 may be electrically connected to the driving electrodes TE.

The touch electrodes TE and RE may be driven in a self-capacitance sensing scheme or a mutual-capacitance sensing scheme. When the touch electrodes TE and RE are driven in the mutual-capacitance sensing, the driving signals are supplied to the driving electrodes TE through the first driving lines TL1 and the second driving lines TL2 such that the mutual capacitances formed at the intersections between the sensing electrodes RE and the driving electrodes TE are charged. Then, changes in the amount of the charges of the sensing electrodes RE are measured through the sensing lines RL, and it is determined whether or not a touch input is made according to the changes in the amount of the charges of the sensing electrodes RE. The driving signals may have driving pulses.

When the touch electrodes TE and RE are driven in the self-capacitance sensing scheme, the driving signals are supplied to the driving electrodes TE as well as the sensing electrodes RE through the first driving lines TL1, the second driving lines TL2, and the sensing lines RL. By doing so, the self capacitances of the driving electrodes TE and the sensing electrodes RE are charged. Then, changes in the amount of the charges of the self-capacitances of the driving electrodes TE and the sensing electrodes RE are measured through the first driving lines TL1, the second driving lines TL2, and the sensing lines RL, and it is determined whether or not a touch input is made based on the changes in the amount of the charges of the self-capacitances.

The driving electrodes TE, the sensing electrodes RE, and the connection electrodes BE may be formed as mesh-shaped electrodes as shown in FIG. 5. When the touch sensor layer TSL including the driving electrodes TE and the sensing electrodes RE is formed directly on the thin-film encapsulation layer TFEL, as shown in FIG. 3, the distance between the second electrode of the emission material layer EML and the driving electrodes TE or the sensing electrodes RE of the touch sensor layer TSL is relatively small. As a result, a very large parasitic capacitance may be formed between the second electrode of the emission material layer EML and the driving electrodes TE or the sensing electrodes RE of the touch sensor layer TSL. To reduce such parasitic capacitance, the driving electrodes TE and the sensing electrodes RE may be formed in the mesh-shaped pattern as shown in FIG. 5 rather than as non-patterned electrodes of a transparent oxide conductive layer, such as ITO and IZO.

A first guard line GL1 may be disposed on the outer side of the outermost one of the sensing lines RL. In addition, a first ground line GRL1 may be disposed on the outer side of the first guard line GL1. For example, the first guard line GL1 may be disposed on the right side of the rightmost one of the sensing lines, and the first ground line GRL1 may be disposed on the right side of the first guard line GL1.

A second guard line GL2 may be disposed between the innermost one of the sensing lines RL and the first driving line TL1, which is the rightmost one of the first driving lines TL1. The second guard line GL2 may be disposed between the rightmost one of the first driving lines TL1 and the second ground line GRL2. Furthermore, a third guard line GL3 may be disposed between the innermost one of the sensing lines RL and the second ground line GRL2. The second ground line GRL2 may be connected to the leftmost one of the first touch pads TP1 and the rightmost one of the second touch pads TP2.

A fourth guard line GL4 may be disposed on the outer side of the outermost one of the second driving lines TL2. In addition, the third ground line GRL3 may be disposed on the outer side of the fourth guard line GL4. For example, the fourth guard line GL4 may be disposed on the left and upper sides of the leftmost and the uppermost one of the second driving lines TL2. The third ground line GRL3 may be disposed on the left and the upper sides of the fourth guard line GL4.

A fifth guard line GL5 may be disposed on the inner side of the innermost one of the second driving lines TL2. For example, the fifth guard line GL5 may be disposed between the rightmost one of the second driving lines TL2 and the touch electrodes TE and RE.

According to the embodiment of the present disclosure shown in FIG. 5, the first ground line GRL1, the second ground line GRL2, and the third ground line GRL3 are disposed on the uppermost side, the leftmost side, and the rightmost side of the display panel 100, respectively. In addition, a ground voltage is applied to the first ground line GRL1, the second ground line GRL2, and the third ground line GRL3. Accordingly, when static electricity is applied from the outside, the static electricity can be discharged to the first ground line GRL1, the second ground line GRL2, and the third ground line GRL3.

In addition, according to the embodiment of the present disclosure shown in FIG. 5, the first guard line GL1 is disposed between the outermost one of the sensing lines RL and the first ground line GRL1 to reduce the influence by a change in the voltage of the first ground line GRL1 on the outermost one of the sensing lines RL. The second guard line GL2 is disposed between the innermost one of the sensing lines RL and the outermost one of the first driving line TL1. Therefore, the second guard line GL2 can reduce the influence by a change in the voltage on the innermost one of the sensing lines RL and on the outermost one of the first driving lines TL1. The third guard line GL3 is disposed between the innermost one of the sensing lines RL and the second ground line GRL2 to reduce the influence by a change in the voltage of the second ground line GRL2 on the innermost one of the sensing lines RL. The fourth guard line GL4 is disposed between the outermost one of the second sensing lines TL2 and the third ground line GRL3 to reduce the influence by a change in the voltage of the third ground line GRL3 on the second driving line TL2. The fifth guard line GL5 is disposed between the innermost one of the second driving lines TL2 and the touch electrodes TE and RE to reduce mutual influence between the innermost one of the second driving lines TL2 and the touch electrodes TE and RE.

When the touch electrodes TE and RE are driven by mutual-capacitance sensing scheme, a ground voltage may be applied to the first guard line GL1, the second guard line GL2, the third guard line GL3, the fourth guard line GL4, and the fifth line GL5. When the touch electrodes TE and RE are driven by self-capacitance sensing scheme, the same driving signals as the driving signals applied to the first driving lines TL1, the second driving lines TL2, and the sensing lines RL may be applied to the first guard line GL1, the second guard line GL2, the third guard line GL3, the fourth guard line GL4, and the fifth guard line GL5.

Referring to FIG. 6, the sub-pixels may include first sub-pixels RP, second sub-pixels GP, and third sub-pixels BP. Each of the first sub-pixels RP may represent (or emit) a first color, each of the second sub-pixels GP may represent a second color, and each of the third sub-pixels BP may represent a third color. The first color may be red, the second color may be green, and the third color may be blue. It is, however, to be understood that the present disclosure is not limited thereto.

In the display panel 100, each of the pixels P may represent a white grayscale. One pixel P may be defined by one first sub-pixel RP, two second sub-pixels GP, and one third sub-pixel BP. In addition, the first sub-pixel RP, the second sub-pixels GP, and the third sub-pixel BP, which are defined as a single pixel P, may be arranged in a diamond shape as shown in FIG. 6.

The number of the first sub-pixels RP may be equal to the number of the third sub-pixels BP in the display panel 100. The number of the second sub-pixels GP in the display panel 100 may be double (e.g., may be equal to twice) the number of the first sub-pixels RP and double (or twice) the number of the third sub-pixels BP. In addition, in the display panel 100, the number of the second sub-pixels GP may be equal to the sum of the number of the first sub-pixels RP and the number of the third sub-pixels BP.

In FIG. 6, the first sub-pixels RP, the second sub-pixels GP, and the third sub-pixels BP have a diamond shape when viewed from the top. It is, however, to be understood that the present disclosure is not limited thereto. For example, the first sub-pixels RP, the second sub-pixels GP, and the third sub-pixels BP may be formed in a rectangular or square shape when viewed from the top or may be formed in any other polygonal shape other than a quadrangular shape, a circular shape, or an elliptic shape. In addition, the first sub-pixels RP, the second sub-pixels GP, and the third sub-pixels BP may have different shapes.

In FIG. 6, the first sub-pixels RP, the second sub-pixels GP, and the third sub-pixels BP have the same size when viewed from the top. It is, however, to be understood that the present disclosure is not limited thereto. For example, the first sub-pixels RP, the second sub-pixels GP, and the third sub-pixels BP may have different sizes when viewed from the top. For example, when viewed from the top, the size of the first sub-pixels RP may be larger than the size of the second sub-pixels GP, and the size of the third sub-pixels BP may be larger than the size of the second sub-pixels GP. In addition, when viewed from the top, the size of the first sub-pixels RP may be substantially equal to or smaller than the size of the third sub-pixels BP.

Figure 7:
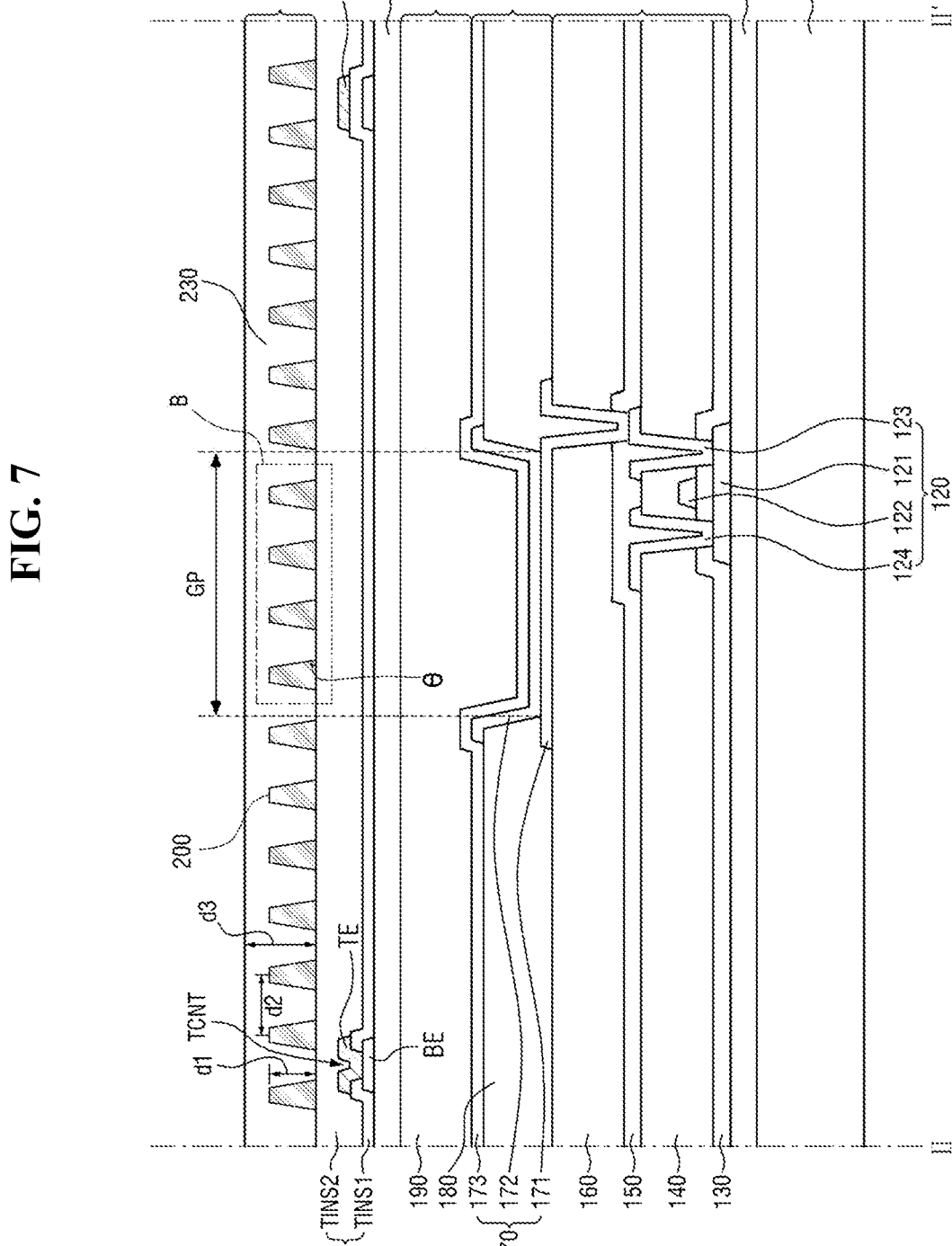
FIG. 7 is a cross-sectional view taken along the line II-II' of FIG. 6.

FIG. 7 is a cross-sectional view taken along the line II-II' of FIG. 6.

Referring to FIG. 7, a thin-film transistor layer TFTL is formed on the substrate SUB. The thin-film transistor layer TFTL includes thin-film transistors 120, a gate insulating layer 130, an interlayer dielectric layer 140, a protective layer 150, and a planarization layer 160.

The first buffer layer BF1 may be formed on one surface of the substrate SUB. The first buffer layer BF1 may be formed on one surface of the substrate SUB to protect the thin-film transistors 120 and organic emitting layer 172 of the light-emitting element layer EML from moisture that is likely to permeate through the substrate SUB. The first buffer layer BF1 may be made up of multiple inorganic films alternately stacked on one another. For example, the first buffer layer BF1 may be made up of multiple films in which one or more inorganic films of a silicon nitride layer, a silicon oxynitride layer, a silicon oxide layer, a titanium oxide layer, and an aluminum oxide layer are alternately stacked on one another. In some embodiments, the first buffer layer BF1 may be omitted.

The thin-film transistors 120 are formed on the first buffer layer BF1. Each of the thin-film transistor 120 includes an activate layer (e.g., a semiconductor layer) 121, a gate electrode 122, a source electrode 123, and a drain electrode 124. In FIG. 7, the thin-film transistors 120 are shown as being implemented as top-gate transistors in which the gate electrode 122 is located above the active layer 121. It is, however, to be understood that the present disclosure is not limited thereto. For example, the thin-film transistors 120 may be implemented as bottom-gate transistors in which the gate electrode 122 is located below the active layer 121 or as double-gate transistors in which the gate electrodes 122 are disposed above and below the active layer 121.

The active layer 121 is formed on the first buffer layer BF1. The active layer 121 may include polycrystalline silicon, single crystal silicon, low-temperature polycrystalline silicon, amorphous silicon, or an oxide semiconductor. The oxide semiconductor may include, for example, a binary compound ($AB_x$), a ternary compound ($AB_xC_y$) and a quaternary compound ($AB_xC_yD_z$) containing indium, zinc, gallium, tin, titanium, aluminum, hafnium (Hf), zirconium (Zr), magnesium (Mg), etc. For example, the active layer 121 may include an oxide including indium, tin, and titanium (ITZO) or an oxide including indium, gallium, and tin (IGZO). A light-blocking layer for blocking external light incident on the active layer 121 may be formed between the buffer layer BF1 and the active layer 121.

The gate insulating layer 130 may be formed on the active layer 121. The gate insulating layer 130 may be formed of an inorganic layer, for example, a silicon nitride layer, a silicon oxynitride layer, a silicon oxide layer, a titanium oxide layer, or an aluminum oxide layer.

The gate electrodes 122 and gate lines may be formed on the gate insulating layer 130. The gate electrodes 122 and the gate lines may be made up of a single layer or multiple layers of one of molybdenum (Mo), aluminum (Al), chromium (Cr), gold (Au), titanium (Ti), nickel (Ni), neodymium (Nd), copper (Cu), or an alloy thereof.

The interlayer dielectric layer 140 may be formed over the gate electrodes 122 and the gate lines. The interlayer dielectric layer 140 may be formed of an inorganic layer, for example, a silicon nitride layer, a silicon oxynitride layer, a silicon oxide layer, a titanium oxide layer, or an aluminum oxide layer.

The source electrodes 123 and the drain electrodes 124 may be formed on the interlayer dielectric layer 140. Each of the source electrodes 123 and the drain electrodes 124 may be connected to the active layer 121 through a contact hole (e.g., a contact opening) penetrating through (e.g., extending through) the gate insulating layer 130 and the interlayer dielectric layer 140. The source electrode 123 and the drain electrode 124 may be made up of a single layer or multiple layers of one of molybdenum (Mo), aluminum (Al), chromium (Cr), gold (Au), titanium (Ti), nickel (Ni), neodymium (Nd), copper (Cu), or an alloy thereof.

The protective layer 150 may be formed on the source electrode 123 and the drain electrode 124 to insulate the thin-film transistors 120. The protective layer 150 may be formed of an inorganic layer, for example, a silicon nitride layer, a silicon oxynitride layer, a silicon oxide layer, a titanium oxide layer, or an aluminum oxide layer.

The planarization layer 160 may be formed on the protective layer 150 to provide a flat surface over (or irrespective of) the step differences in the thin-film transistors 120. The planarization layer 160 may be formed of an organic layer, such as an acryl resin, an epoxy resin, a phenolic resin, a polyamide resin, and a polyimide resin.

The emission material layer EML is formed on the thin-film transistor layer TFTL. The emission material layer EML includes light-emitting elements 170 and a bank (e.g., a pixel-defining layer) 180.

The light-emitting elements 170 and the pixel-defining layer 180 are formed on the planarization layer 160. Each of the light-emitting elements 170 may include a first electrode 171, an organic emitting layer 172, and a second electrode 173.

The first electrode 171 may be formed on the planarization layer 160. The first electrode 171 is connected to the source electrode 123 of the thin-film transistor 120 through the contact hole penetrating through the protective layer 150 and the planarization layer 160.

In a top-emission organic light-emitting diode that emits light from the organic emitting layer 172 toward the second electrode 173, the first electrode 171 may be made of a metal material having a high reflectivity, such as a stack structure of aluminum and titanium (Ti/Al/Ti), a stack structure of aluminum and ITO (ITO/Al/ITO), an APC alloy, and a stack structure of an APC alloy and ITO (ITO/APC/ITO). The APC alloy is an alloy of silver (Ag), palladium (Pd) and copper (Cu).

In a bottom-emission organic light-emitting diode that emits light from the organic emitting layer 172 toward the first electrode 171, the first electrode 171 may be formed of a transparent conductive material (TCP), such as ITO and IZO, that can transmit light, or a semi-transmissive conductive material, such as magnesium (Mg), silver (Ag) and an alloy of magnesium (Mg) and silver (Ag). In an embodiment in which the first electrode 171 is made of a semi-transmissive metal material, the light extraction efficiency can be increased by using microcavities.

The pixel-defining layer 180 may separate the first electrodes 171 from one another on the planarization layer 160 to define the sub-pixels RP, GP, and BP. The pixel-defining layer 180 may be formed to cover an edge (e.g., a periphery) of the first electrode 171. The pixel-defining layer 180 may be formed of an organic layer, such as an acryl resin, an epoxy resin, a phenolic resin, a polyamide resin, and a polyimide resin.

In each of the sub-pixels RP, GP, and BP, the first electrode 171, the organic emitting layer 172, and the second electrode 173 are stacked on one another sequentially so that holes from the first electrode 171 and electrons from the second electrode 173 are combined with each other in the organic emitting layer 172 to emit light. Each of the sub-pixels RP, GP, and BP may include the light-emitting elements 170.

The organic emitting layer 172 is formed on the first electrode 171 and the pixel-defining layer 180. The organic emitting layer 172 may include an organic material and may be configured to emit light of a particular color. For example, the organic emitting layer 172 may include a hole transporting layer, an organic material layer, and an electron transporting layer. In the illustrated embodiment, the organic emitting layer 172 of the first sub-pixel RP may emit light of the first color, the organic emitting layer 172 of the second sub-pixel GP may emit light of the second color, and the organic emitting layer 172 of the third sub-pixel BP may emit light of the third light. The first color may be red, the second color may be green, and the third color may be blue. It is, however, to be understood that the present disclosure is not limited thereto.

In another embodiment, the organic emitting layer 172 of each of the sub-pixels RP, GP, and BP may emit white light. In such an embodiment, the first sub-pixel RP may overlap with the color filter layer of the first color, the second sub-pixel GP may overlap with the color filter layer of the second color, and the third sub-pixel BP may overlap with the color filter layer of the third color.

The second electrode 173 is formed on the organic emitting layer 172. The second electrode 173 may be formed to cover the organic emitting layer 172. The second electrode 173 may be a common layer formed across the sub-pixels RP, GP, and BP. A capping layer may be formed on the second electrode 173.

In the top-emission organic light-emitting diode, the second electrode 173 may be formed of a transparent conductive material (TCP), such as ITO and IZO, that can transmit light, or a semi-transmissive conductive material, such as magnesium (Mg), silver (Ag), and an alloy of magnesium (Mg) and silver (Ag). When the second electrode 173 is formed of a semi-transmissive conductive material, the light extraction efficiency can be increased by using microcavities.

In the bottom-emission organic light-emitting diode, the second electrode 173 may be made of a metal material having a high reflectivity, such as a stack structure of aluminum and titanium (Ti/Al/Ti), a stack structure of aluminum and ITO (ITO/Al/ITO), an APC alloy, and a stack structure of an APC alloy and ITO (ITO/APC/ITO). The APC alloy is an alloy of silver (Ag), palladium (Pd), and copper (Cu).

The thin-film encapsulation layer TFEL is formed on the light-emitting element layer EML. The thin-film encapsulation layer TFEL includes an encapsulation layer 190.

The encapsulation layer 190 is disposed on the second electrode 173. The encapsulation layer 190 may include at least one inorganic layer to prevent oxygen or moisture from permeating into the organic emitting layer 172 and the second electrode 173. In addition, the encapsulation layer 190 may include at least one organic layer to protect the light-emitting element layer EML from foreign substances, such as dust. For example, the encapsulation layer 190 may include a first inorganic layer disposed on the second electrode 173, an organic layer disposed on the first inorganic layer, and a second inorganic layer disposed on the organic layer. The first inorganic layer and the second inorganic layer may be formed of, but are not limited to, a silicon nitride layer, a silicon oxynitride layer, a silicon oxide layer, a titanium oxide layer, or an aluminum oxide layer. The organic layer may be formed of, but is not limited to, an acryl resin, an epoxy resin, a phenolic resin, a polyamide resin, a polyimide resin, etc.

A second buffer layer BF2 is formed on the thin-film encapsulation layer TFEL. The second buffer layer BF2 may be made up of multiple inorganic layers sequentially stacked on one another. For example, the second buffer layer BF2 may be made up of multiple layers in which one or more inorganic layers of a silicon nitride layer, a silicon oxynitride layer, a silicon oxide layer, a titanium oxide layer, and an aluminum oxide layer are alternately stacked on one another. In some embodiments, the second buffer layer BF2 may be omitted.

The touch sensor layer TSL is formed on the second buffer layer BF2. As shown in FIG. 5, the touch sensor layer TSL may include the driving electrodes TE, the sensing electrodes RE, the connection electrodes BE, the first driving lines TL1, the second driving lines TL2, the sensing lines RL, the guard lines GL1, GL2, GL3, GL4 and GL5, and the ground lines CRL1, CRL2 and CRL3. FIG. 7 shows only the driving electrodes TE of the touch sensor layer TSL for convenience of illustration.

The connection electrodes BE may be disposed on the second buffer layer BF2. The connection electrode BE may be made up of a single layer or multiple layers of one of molybdenum (Mo), aluminum (Al), chromium (Cr), gold (Au), titanium (Ti), nickel (Ni), neodymium (Nd), copper (Cu), or an alloy thereof.

A first touch insulating layer TINS1 is disposed over the connection electrodes BE. The first touch insulating layer TINS1 may be made of an inorganic film, for example, silicon nitride, silicon oxide, silicon nitride oxide, titanium oxide, or aluminum oxide. In another embodiment, the first touch insulating layer TINS1 may be formed of an organic layer, such as an acryl resin, an epoxy resin, a phenolic resin, a polyamide resin, and a polyimide resin.

The driving electrodes TE and the sensing electrodes RE may be disposed on the first touch insulating layer TINS1. In addition to the driving electrodes TE and the sensing electrodes RE, the first driving lines TL1, the second driving lines TL2, the sensing lines RL, the guard lines GL1, GL2, GL3, GL4, and GL5, and the ground lines GRL1, GRL2, and GRL3 may be disposed on the first touch insulating layer TINS1. For example, the driving electrodes TE, the sensing electrodes RE, the first driving lines TL1, the second driving lines TL2, the sensing lines RL, the guard lines GL1, GL2, GL3, GL4, and GL5, and the ground lines GRL1, GRL2, and GRL3, but not the connection electrodes BE, may be disposed on the same layer and may be made of the same material. The driving electrodes TE, the sensing electrodes RE, the first driving lines TL1, the second driving lines TL2, the sensing lines RL, the guard lines GL1, GL2, GL3, GL4, and GL5, and the ground lines GRL1, GRL2, and GRL3 may be made of, but are not limited to, a stack structure of aluminum and titanium (Ti/Al/Ti), a stack structure of aluminum and ITO (ITO/Al/ITO), an APC alloy, and a stack structure of an APC alloy and ITO (ITO/APC/ITO). The connection electrode BE shown in FIG. 5 may be formed on the first touch insulating layer TINS1. Each of the connection electrodes BE may be connected to the driving electrodes TE through a touch contact hole (e.g., a touch contact opening) TCNT penetrating (or extending through) the touch insulating layer TINS. The driving electrodes TE arranged in the second direction (y-axis direction) can be electrically connected to one another by the connection electrodes BE. The connection electrodes BE may be formed as, but is not limited to, a stack structure of aluminum and titanium (Ti/Al/Ti), a stack structure of aluminum and ITO (ITO/Al/ITO), an APC alloy, and a stack structure of APC alloy and ITO (ITO/APC/ITO).

The second touch insulating layer TINS2 is formed over the driving electrodes TE and the sensing electrodes RE. The second touch insulating layer TINS2 may provide a flat surface over level (or step) differences formed by the driving electrodes TE, the sensing electrodes RE, and the connection electrodes BE. The second touch insulating layer TINS2 may be formed of an organic layer, such as an acryl resin, an epoxy resin, a phenolic resin, a polyamide resin, and a polyimide resin.

The viewing angle control layer LCL is disposed on the touch sensor layer TSL, for example, on the second touch insulating layer TINS2. The viewing angle control layer LCL absorbs some of the light that is output from the sub-pixels RP, GP, and BP and travels toward the sides rather than upward (in the z-axis direction). The viewing angle control layer LCL may include viewing angle control patterns 200 and a planarization layer 230.

The viewing angle control patterns 200 may be disposed on the touch insulating layer TINS (e.g., on the second touch insulating layer TINS2). At least some of the viewing angle control patterns 200 may overlap with the touch electrodes TE and RE.

The viewing angle control pattern 200 may be formed of an inorganic layer, for example, a silicon nitride layer, a silicon oxynitride layer, a silicon oxide layer, a titanium oxide layer, or an aluminum oxide layer.

The viewing angle control patterns 200 are arranged at a uniform distance (e.g., at a uniform spacing) in the first direction (x-axis direction). Each of the viewing angle control patterns 200 has sidewalls having low light reflection and high light absorption. The angle formed between the touch insulating layer TINS and the inner walls of the viewing angle control patterns 200 may be equal to or less than about 90 degrees, and the inner walls may be formed in a taper shape. The angle formed by the inner walls of the viewing angle control patterns 200 is, in some embodiments, closer to about 90 degrees because loss of light traveling toward the upper side of the display panel 100 (in the z-axis direction) from among light emitted from the emission material layer EML can be more effectively prevented.

As the height d1 of the sidewalls of the viewing angle control patterns 200 increases, the ratio of light absorbed by the sidewalls of the viewing angle control patterns 200 relative to the light emitted from the sub-pixels RP, GP, and BP may increase. Therefore, to increase the efficiency of absorbing light traveling toward the sides of the sub-pixels RP, GP, and BP, the height d1 of the viewing angle control patterns 200 may be in range from about 5 μm to about 12 μm and, in one embodiment, may be approximately 10 μm. The height d1 of the viewing angle control patterns 200 refers to the distance from the lower surface to the upper surface of the viewing angle control patterns 200.

The upper surfaces of the viewing angle control patterns 200 have light transmittance.

In addition, as the number of the viewing angle control patterns 200 increases, the efficiency of absorbing the light traveling toward the sides from the sub-pixels RP, GP, and BP can be increased. However, as the number of the viewing angle control patterns 200 on the sub-pixels RP, GP, and BP increases, the percentage of the light traveling toward the upper side of the sub-pixels RP, GP, and BP (in the z-axis direction) may be reduced due to the thickness of the sidewalls of the viewing angle control patterns 200. Accordingly, the separation distance (e.g., a center-to-center spacing distance) d2 between the viewing angle control patterns 200 may be formed at the same ratio as the height d1 of the viewing angle control patterns 200. For example, when the height d1 of the viewing angle control patterns 200 is about 10 μm, the separation distance d2 between the viewing angle control patterns 200 may be about 10 μm as well. Herein, the separation distance between the viewing angle control patterns 200 may be the distance from the central axis of a first viewing angle control pattern to the central axis of a second viewing angle control pattern adjacent to the first viewing angle control pattern.

At least some of the viewing angle control patterns 200 may overlap with the driving electrodes TE or the sensing electrodes RE.

The planarization layer 230 may be formed on the touch insulating layer TINS and the viewing angle control patterns 200 as shown in FIG. 7. The planarization layer 230 provides a flat surface over the viewing angle control patterns 200 having different levels (or steps). The height d3 of the planarization layer 230 is equal to or larger than the height d1 of the viewing angle control patterns 200. For example, the height d3 of the planarization layer 230 may range from approximately 5 μm to approximately 13 μm. The height d3 of the planarization layer 230 may refer to the maximum thickness of the high-refractive planarization layer 230 (e.g., a height measured from the touch insulating layer TINS).

Figure 8:
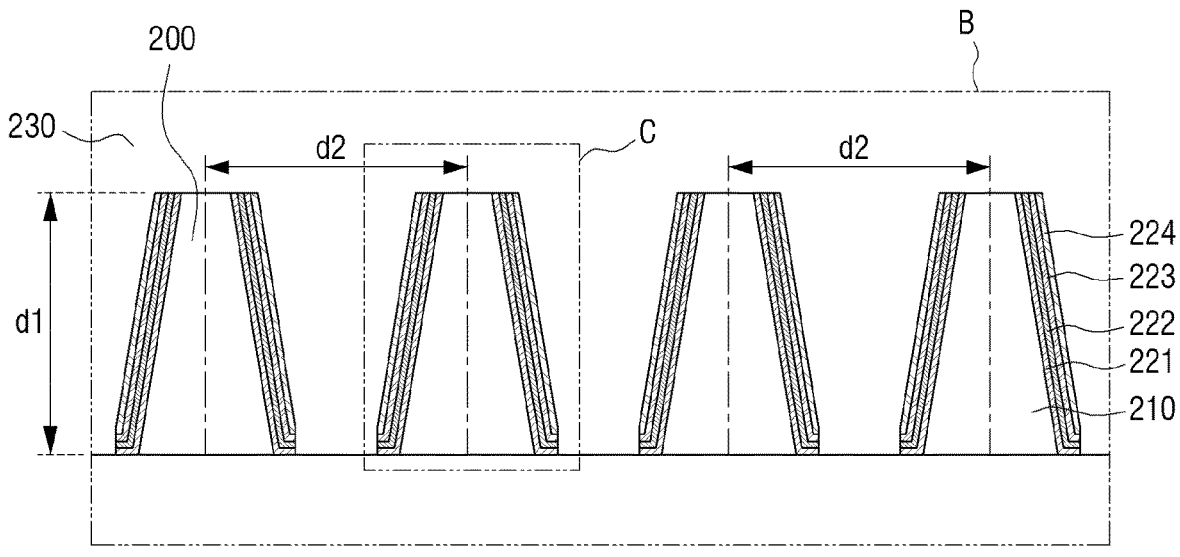
FIG. 8 is an enlarged view of the area B of FIG. 7.
Figure 9:
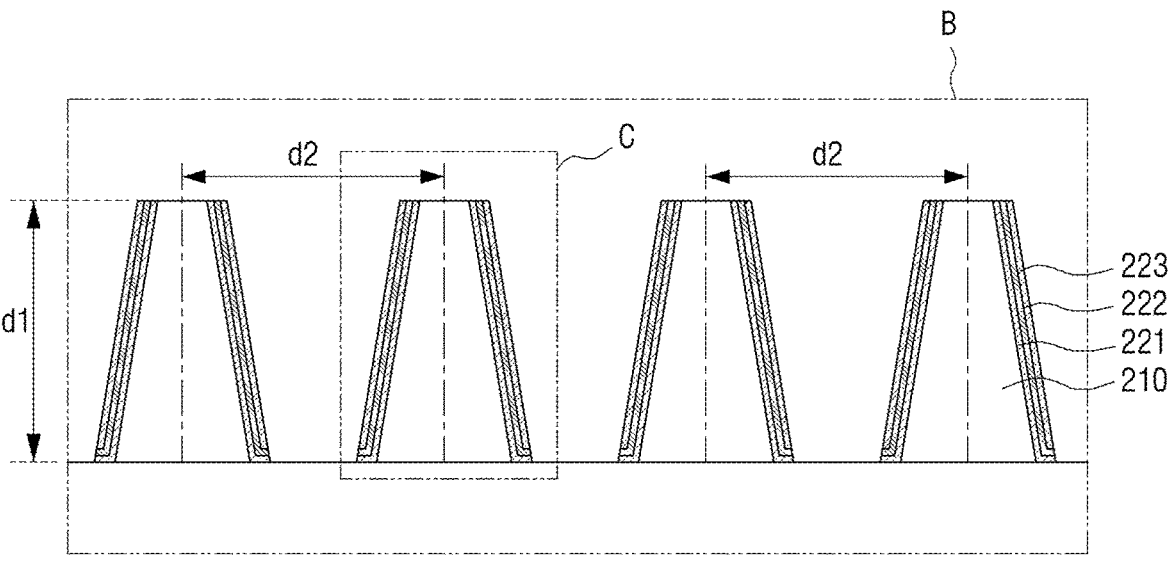
FIG. 9 is an enlarged view of the area B of FIG. 7 according to another embodiment.

FIG. 8 is an enlarged view of the area B in FIG. 7. FIG. 9 is an enlarged view of the area B in FIG. 7 according to another embodiment.

Figure 10:
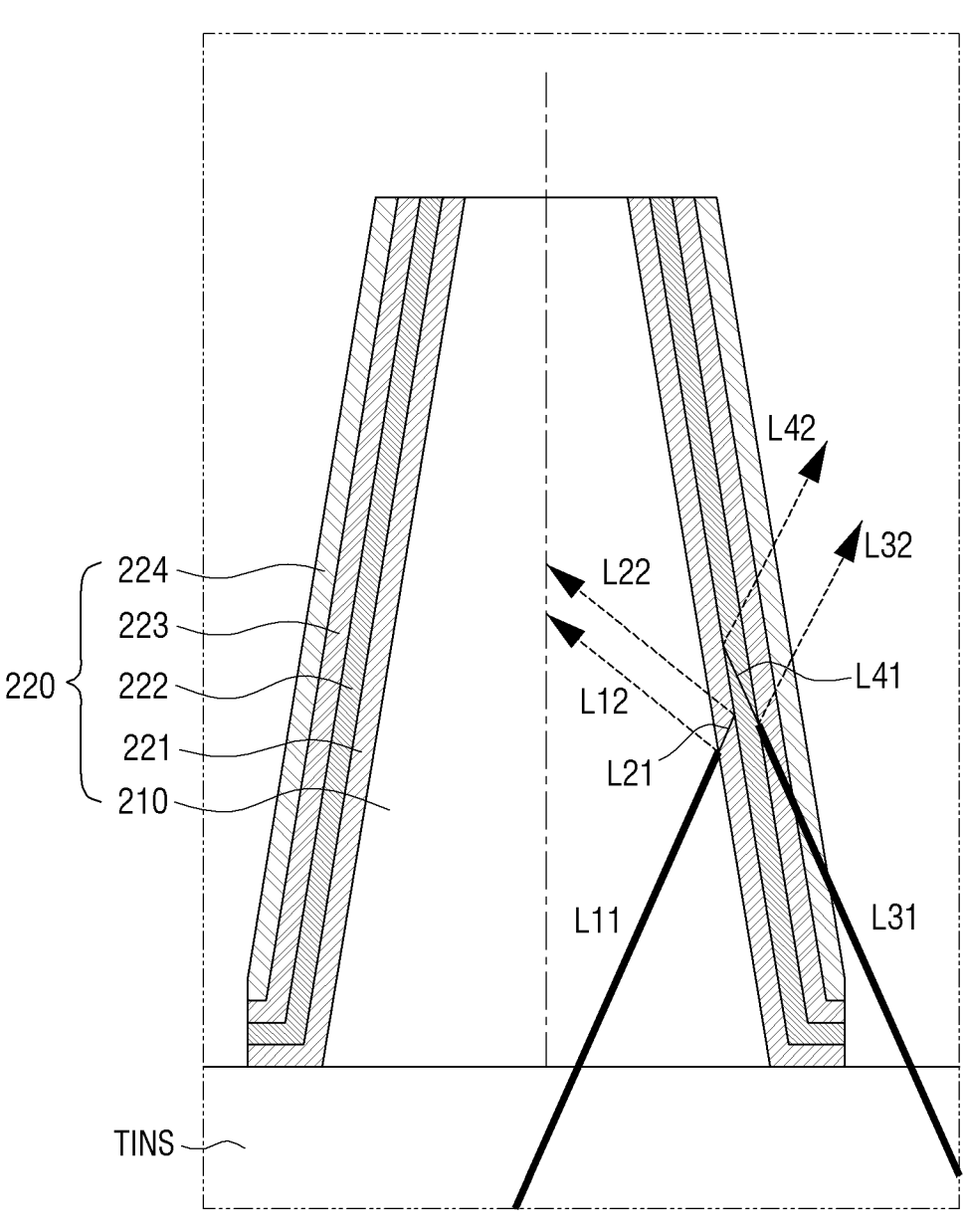
FIG. 10 shows a progression of light incident on a viewing angle control pattern according to an embodiment.
Figure 11:
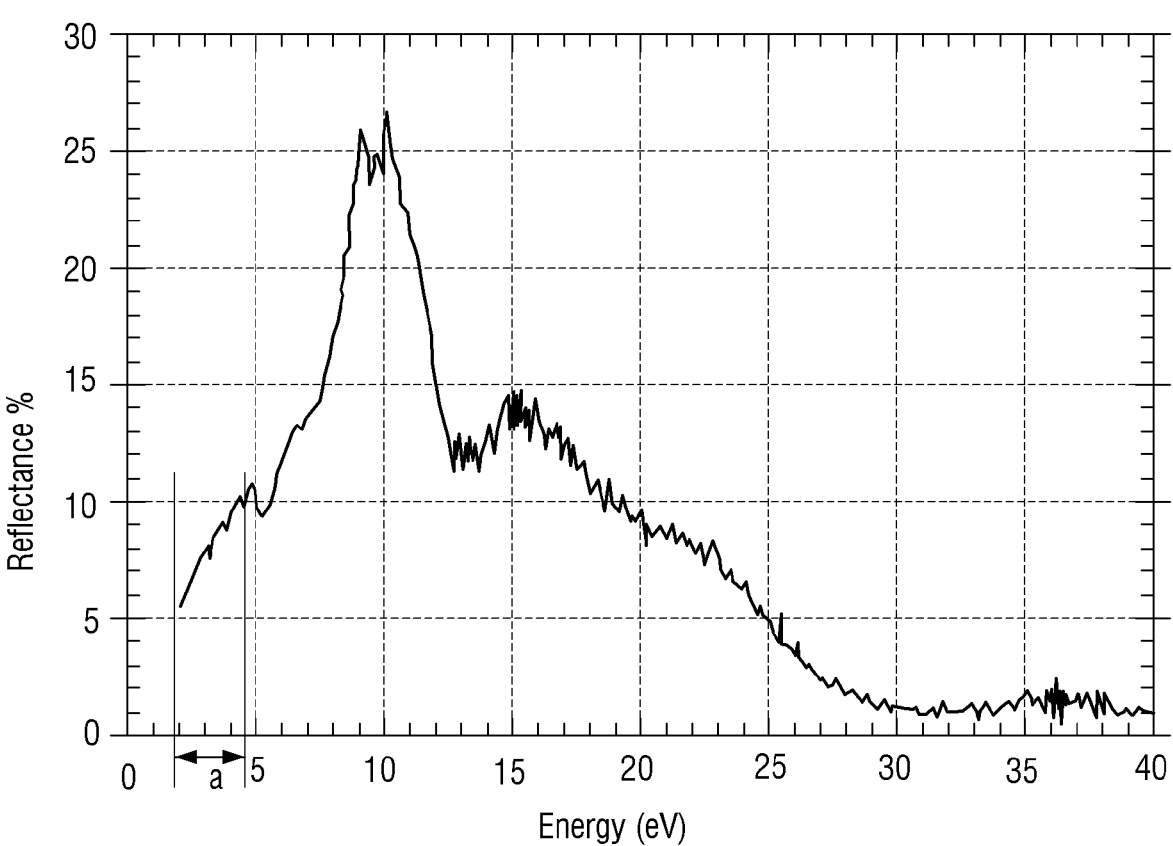
FIG. 11 is a graph illustrating reflectance characteristics of AlN with respect to light wavelengths.

FIG. 10 is a view illustrating the progression of light incident on a viewing angle control pattern according to an embodiment. FIG. 11 is a graph showing reflectance characteristics of AlN with respect to light wavelengths.

Referring to FIGS. 7 and 8, the viewing angle control layer LCL may include the viewing angle control patterns 200 and the planarization layer 230.

The plurality of viewing angle control patterns 200 may overlap with one sub-pixel GP.

The ratio of the width of each of the viewing angle control patterns 200 to the width of the sub-pixel GP may be in range from about 1:3 to about 1:4.

In addition, the ratio of the width of each of the viewing angle control patterns 200 to the width of the organic emitting layer 172 may be in a range from about 1:3 to about 1:4.

Each of the viewing angle control patterns 200 includes a transparent insulating layer pattern 210 and multi-layer sidewalls 220.

The transparent insulating layer pattern 210 may be formed of an inorganic layer, for example, a silicon nitride layer, a silicon oxynitride layer, a silicon oxide layer, a titanium oxide layer, or an aluminum oxide layer.

The sidewalls 220 are disposed on the side surfaces of the transparent insulating layer patterns 210. The sidewalls 220 may be made up of multiple layers including a first metal nitride layer 221, a metal layer 222, a second metal nitride layer 223, and a metal oxide layer 224 from inside to outside.

The first metal nitride layer 221 is located at the innermost position of the viewing angle control pattern 200 (e.g., is formed on the transparent insulating layer pattern 210) and has low reflectance and high light absorption with respect to the visible light region (a) (see, e.g., FIG. 11). The first metal nitride layer 221 may be formed of, for example, AlN or TiN.

The thickness of the first metal nitride layer 221 may be in a range from about 400 Å to about 700 Å, for example, about 600 Å.

As shown in FIG. 11, AlN has a relatively low reflectance of about 5% or less in the visible light region (a) of 1 eV to 4 eV.

Referring back to FIGS. 7 and 8, the metal layer 222 is a layer for destructive interference of a first reflected light L12 (see, e.g., FIG. 10) reflected by the first metal nitride layer 221 and a second reflected light L22 reflected by the metal layer 222 and has a light-absorbing characteristic.

The metal layer 222 may be made of, for example, Al or Ti.

The thickness of the metal layer 222 may be greater than the thickness of the first metal nitride layer 221.

The thickness of the metal layer 222 may be in a range from about 700 Å to about 1000 Å, for example, about 800 Å.

The second metal nitride layer 223 has relatively low reflectance and high light absorption with respect to (or across) the entire wavelength of visible light.

The second metal nitride layer 223 may be made of the same material as the first metal nitride layer 221.

The second metal nitride layer 223 may be made of, for example, AlN or TiN.

The thickness of the second metal nitride layer 223 may be equal to that of the first metal nitride layer 221.

The thickness of the second metal nitride layer 223 may be in a range from about 400 Å to about 700 Å, for example, about 600 Å.

The metal oxide layer 224 protects the sidewalls 220 of the viewing angle control pattern 200 as the outermost layer of the viewing angle control pattern 200. The metal oxide layer 224 may be formed of, for example, aluminum oxide (e.g., $Al_2O_3$).

The thickness of the metal oxide layer 224 may be smaller than the thickness of the first metal nitride layer 221.

The thickness of the metal oxide layer 224 may be in a range from about 100 Å to about 300 Å, for example, about 200 Å.

As shown in FIG. 9, in some embodiments, the metal oxide layer 224 may be omitted.

The first metal nitride layer 221, the metal layer 222, and the second metal nitride layer 223 may include the same metal. For example, the first metal nitride layer 221, the metal layer 222, and the second metal nitride layer 223 may be formed of AlN, Al, and AlN, respectively.

Referring to FIG. 10, the first metal nitride layer 221 absorbs a first light L11 incident into the viewing angle control pattern 200. Most of the first light L11 incident on the first metal nitride layer 221 is absorbed by the first metal nitride layer 221. The first reflected light L12, which is not absorbed by the first metal nitride layer 221, is reflected. A second light L21, which is the remaining light that is neither reflected nor absorbed by the first metal nitride layer 221, proceeds to the metal layer 222.

Most of the second reflected light L22 incident on the metal layer 222 is absorbed. The second reflected light L22, which is not absorbed by the metal layer 222, is reflected. The first reflected light L12 and the second reflected light L22 may cancel each other out. Therefore, when light that is emitted from the emission material layer EML and travels toward the sides of the display panel 100 rather than toward the upper side (in the z-axis direction) are incident on the sidewalls of the viewing angle control pattern 200, most of the lights may be absorbed or may destructively interfere with each other and disappear.

The second metal nitride layer 223 absorbs a third light L31 incident from the outside of the viewing angle control pattern 200. The first reflected light L32, which is not absorbed by the second metal nitride layer 223, is reflected. A fourth light L41, which is the remaining light that is neither reflected nor absorbed by the second metal nitride layer 223, proceeds to the metal layer 222.

Most of the fourth reflected light L41 incident on the metal layer 222 is absorbed. A fourth reflected light L42, which is not absorbed by the metal layer 222, is reflected. The third reflected light L32 and the fourth reflected light L42 may cancel each other out. In this manner, light outside the viewing angle range can be removed (or cancelled) and luminance on the front side can be improved.

FIG. 12 is a flowchart describing steps of a method of fabricating a display device according to an embodiment of the present disclosure. FIGS. 13 to 19 are cross-sectional views for illustrating steps of a method of fabricating a display device according to an embodiment of the present disclosure.

A plurality of transparent insulating layer patterns is formed on a display panel (step S110 in FIG. 12).

Referring to FIG. 13, according to an embodiment, the transparent insulating layer patterns 210 are formed on a touch insulating layer TINS.

The transparent insulating layer patterns 210 may be formed by using a mask or a hard mask.

The transparent insulating layer patterns 210 may be formed via a photo-lithography process. For example, a material for forming the transparent insulating layer patterns 210 is applied on the touch insulating layer TINS, and then, the material for forming the transparent insulating layer patterns 210 is selectively etched by using a mask for forming patterns so that the transparent insulating layer patterns 210 is formed. For a photo-process for the mask, the size and position of the patterns can be easily adjusted, but the transparent insulating layer patterns 210 may be formed using a hard mask as well.

The cross-section of the transparent insulating layer pattern 210 may be an isosceles trapezoid with the lower side thereof in contact with the touch insulating layer TINS. The base angles of the isosceles trapezoid may be between about 60 degrees and about 89.5 degrees.

Figure 14:
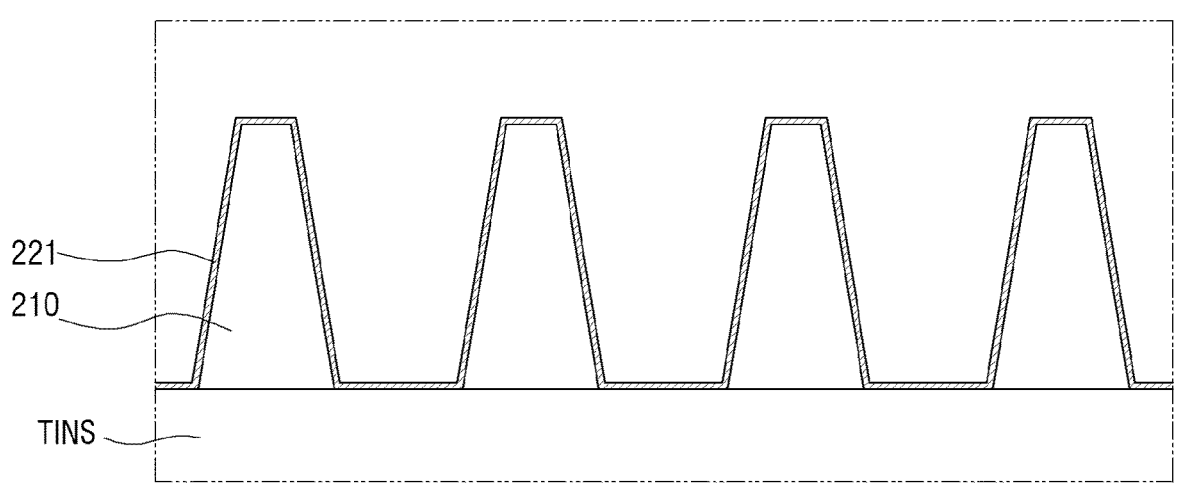
Figure 15:
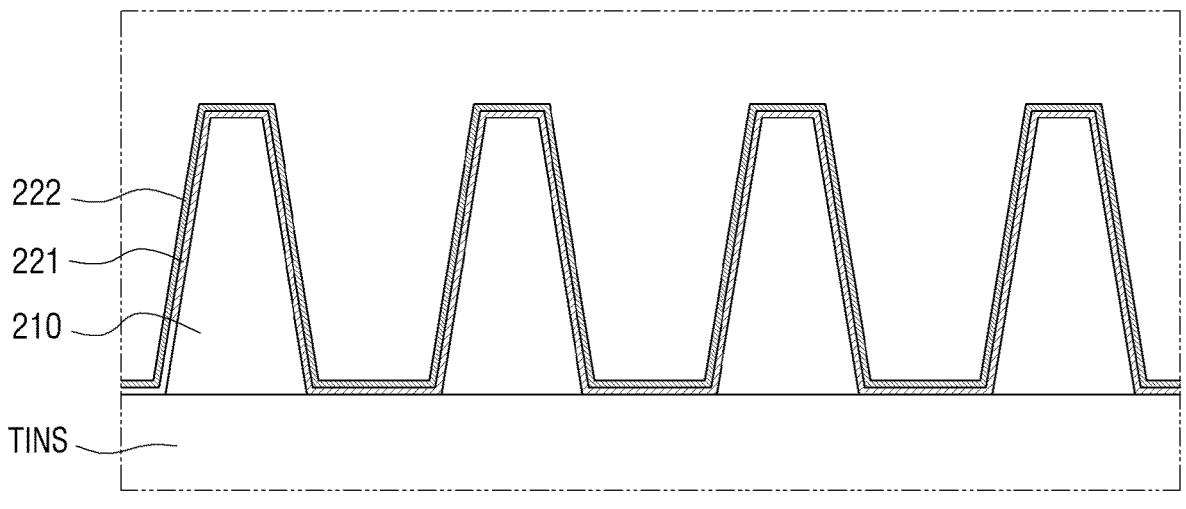
Figure 16:
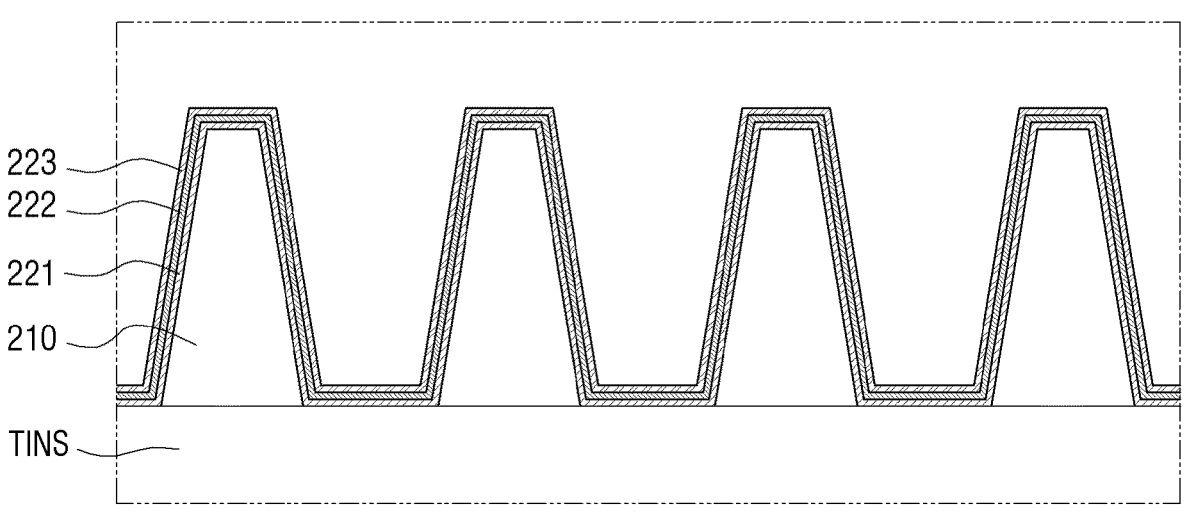
Figure 17:
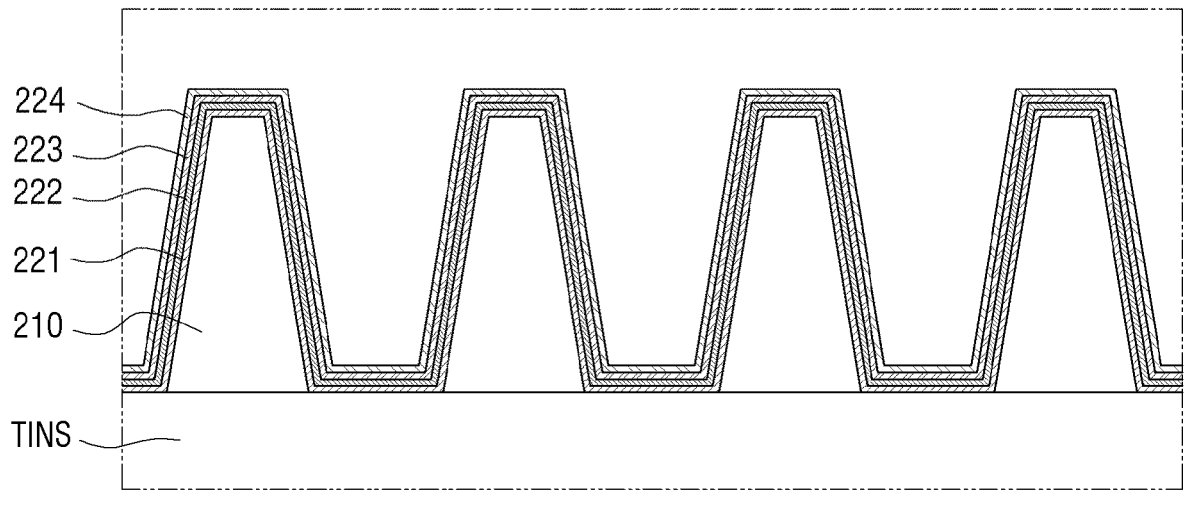

Referring to FIGS. 14 and 17, a first metal nitride layer 221, a metal layer 222, a second metal nitride layer 223, and a metal oxide layer 224 may be stacked in this order to cover the transparent insulating layer patterns 210 (step S120 in FIG. 12).

The first metal nitride layer 221, the metal layer 222, the second metal nitride layer 223, and the metal oxide layer 224 may be formed by an electron beam deposition method, physical vapor deposition (PVD), chemical vapor deposition (CVD), plasma laser deposition (PLD), dual-type thermal evaporation, sputtering, metal-organic chemical vapor deposition (MOCVD), etc. In one embodiment, these layers may be formed by metal-organic chemical vapor deposition (MOCVD). It is, however, to be understood that the present disclosure is not limited thereto.

The first metal nitride layer 221, the metal layer 222, the second metal nitride layer 223, and the metal oxide layer 224 may be made of (or may include) the same metal. For example, the first metal nitride layer 221, the metal layer 222, the second metal nitride layer 223, and the metal oxide layer 224 may be formed of AlN, Al, AlN, and $Al_2O_3$, respectively.

According to another embodiment, the metal oxide layer 224 may be omitted.

Figure 18:
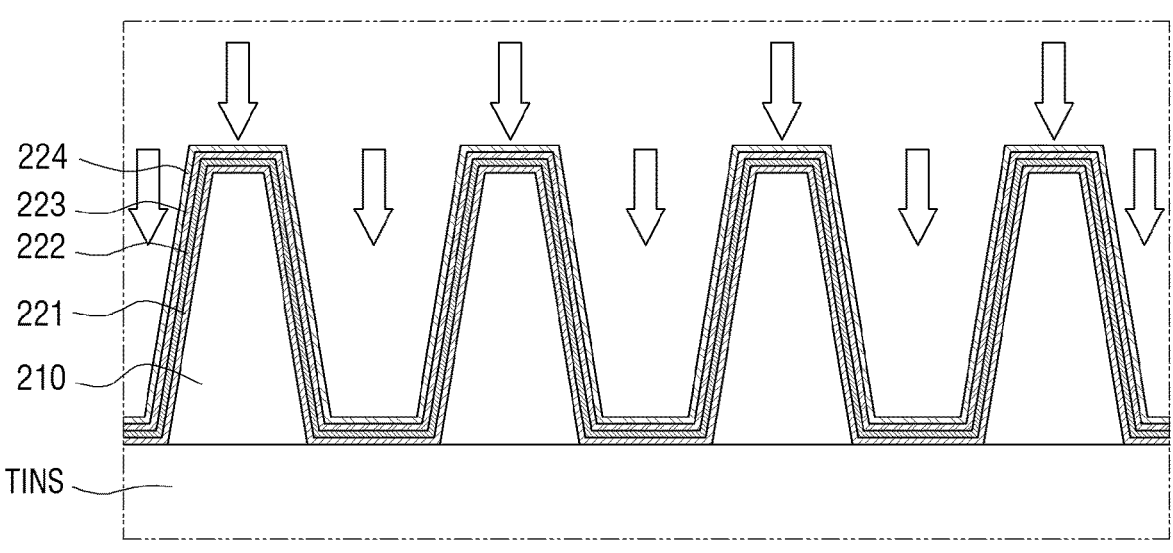
Figure 19:
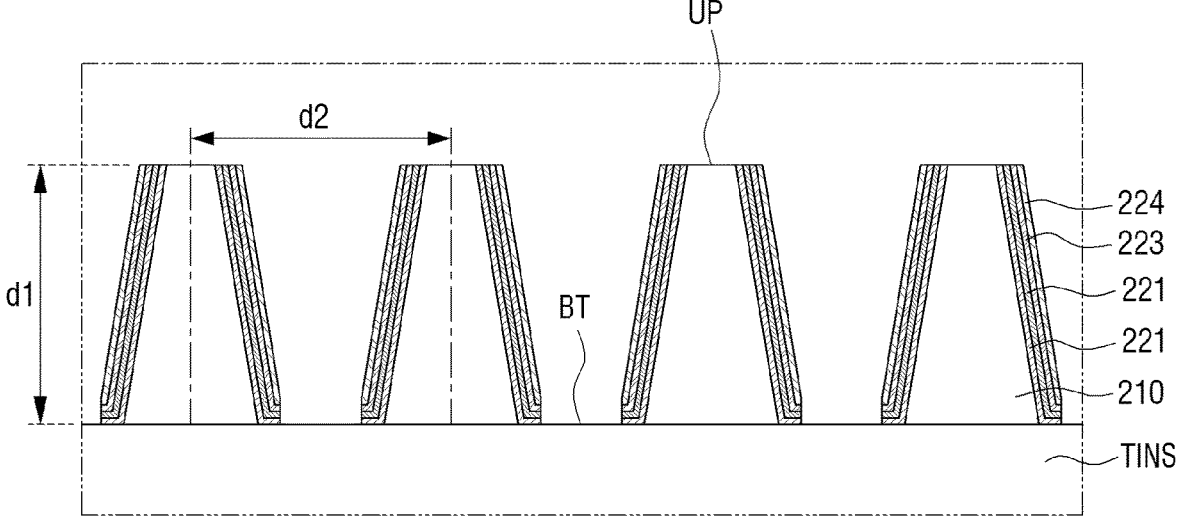

Referring to FIGS. 18 and 19, the first metal nitride layer 221, the metal layer 222, the second metal nitride layer 223, and the metal oxide layer 224 stacked on the upper surfaces of the transparent insulating layer patterns 210 (UP) and on the touch insulating layer TINS between the transparent insulating layer patterns 210 (BT) are removed (step S130 of FIG. 12).

A light-absorbing layer including the first metal nitride layer 221, the metal layer 222, the second metal nitride layer 223, and the metal oxide layer 224 is etched by anisotropic etching. For example, the light-absorbing layer formed on the vertical (or near vertical) surfaces of the transparent insulating layer patterns 210 are not etched, but the light-absorbing layer formed on the horizontal surfaces of the transparent insulating layer patterns 210 and between the transparent insulating layer patterns 210 are etched.

For example, a large voltage difference is formed in a third direction (e.g., a vertical direction) without any mask, and the first metal nitride layer 221, the metal layer 222, the second metal nitride layer 223, and the metal oxide layer 224 are etched with an etching material. As a result, the etching material moves in the third direction by voltage control (e.g., moves from the upper side to the lower side) and the light-absorbing layer including the first metal nitride layer 221, the metal layer 222, the second metal nitride layer 223, and the metal oxide layer 224 may be etched (e.g., may be selectively etched).

The etching material may be a material that can etch out all of the first metal nitride layer 221, the metal layer 222, the second metal nitride layer 223, and the metal oxide layer 224.

In this manner, as shown in FIG. 18, while the first metal nitride layer 221, the metal layer 222, the second metal nitride layer 223, and the metal oxide layer 224, that is, the light-absorbing layer, stacked on the upper surfaces of the transparent insulating layer patterns 210 (UP) and between the transparent insulating layer pattern 210 (BT) on the horizontal plane defined by the first and second directions and are removed, the first metal nitride layer 221, the metal layer 222, the second metal nitride layer 223, and the metal oxide layer 224 disposed on the vertical plane defined by the third direction are not removed.

If the metal oxide layer 224 is not deposited in step S120, the first metal nitride layer 221, the metal layer 222, and the second metal nitride layer 223 may form the light-absorbing layer, and the light-absorbing layer formed by the first metal nitride layer 221, the metal layer 222 and the second metal nitride layer 223 is anisotropically etched in step S130.

Figure 20:
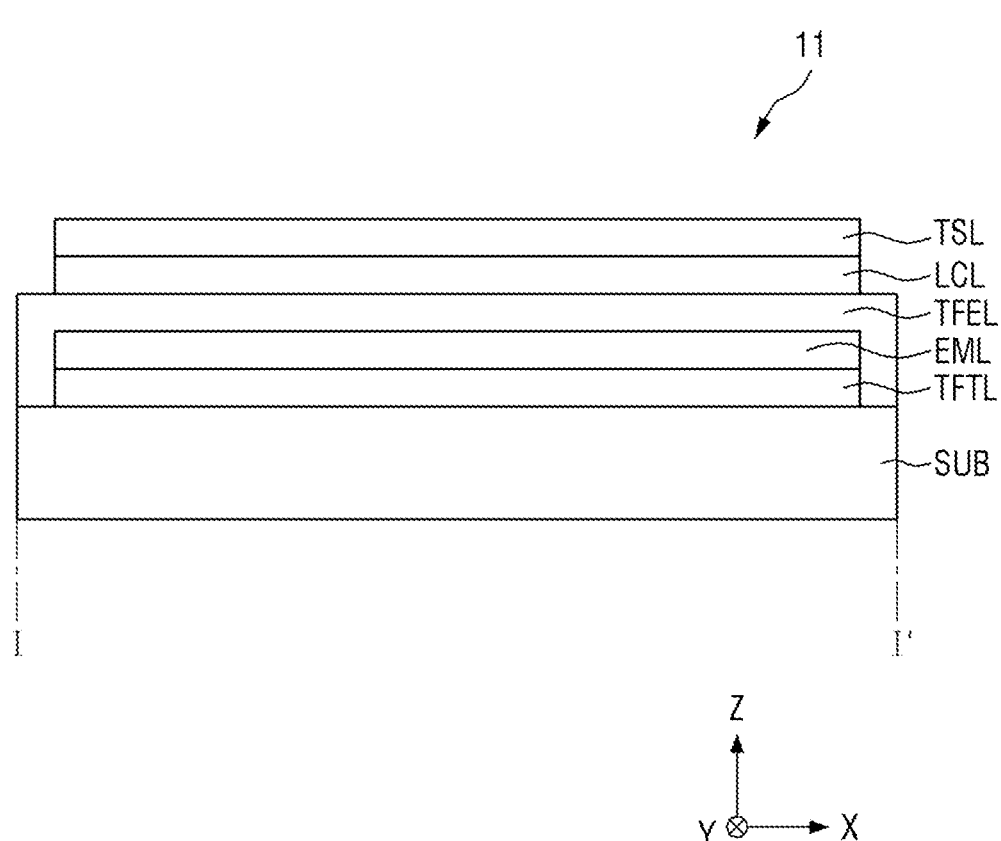
FIG. 20 is a cross-sectional view taken along the line I-I' of FIG. 2 according to another embodiment of the present disclosure.
Figure 21:
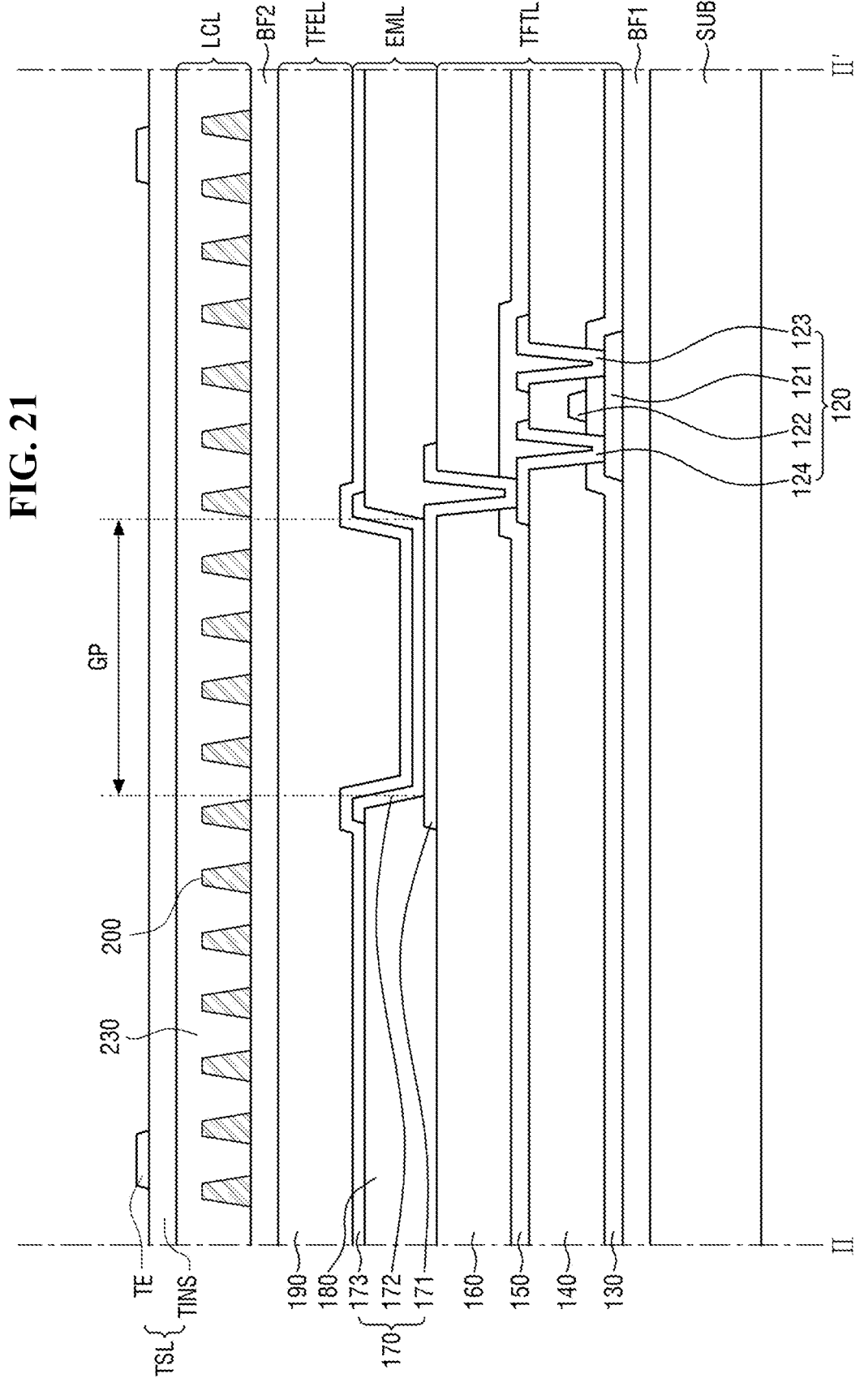
FIG. 21 is a cross-sectional view of the display device including the touch sensor layer and the viewing angle control layer shown in FIG. 20.

FIG. 20 is a cross-sectional view taken along the line I-I' of FIG. 2 according to another embodiment of the present disclosure. FIG. 21 is a cross-sectional view showing an example of the display device including the touch sensor layer and the viewing angle control layer shown in FIG. 20.

The embodiment shown in FIGS. 20 and 21 is different from the embodiment shown in FIGS. 3 and 7 in that the position of a viewing angle control layer LCL is different.

Referring to FIGS. 20 and 21, a display device 11 may include a substrate SUB, a thin-film transistor layer TFTL disposed on the substrate SUB, an emission material layer EML, a thin-film encapsulation layer TFEL, a viewing angle control layer LCL, and a touch sensor layer TSL in this order.

The viewing angle control layer LCL may be disposed under a first touch insulating layer TINS1. The viewing angle control layer LCL may be disposed between the thin-film encapsulation layer TFEL and the first touch insulating layer TINS1. For example, the viewing angle control layer LCL may be formed on a second buffer layer BF2 formed on the thin-film encapsulation layer TFEL.

Figure 22:
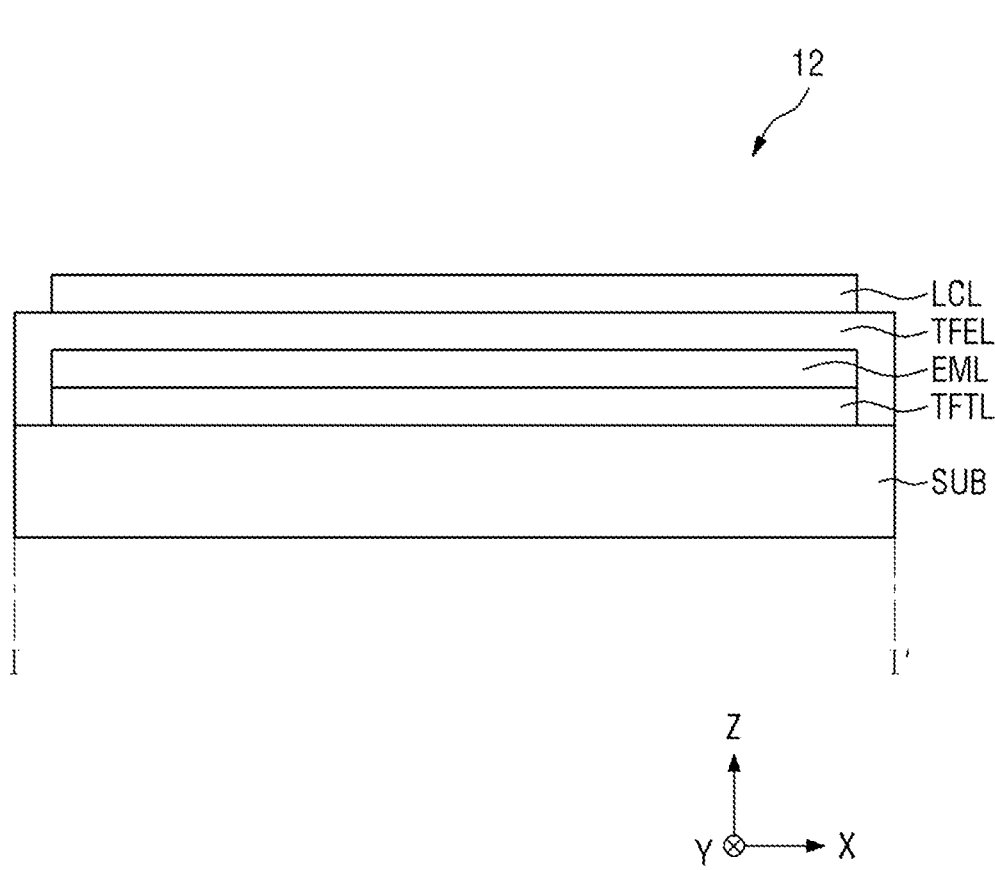
FIG. 22 is a cross-sectional view taken along the line I-I' of FIG. 2 according to another embodiment of the present disclosure.
Figure 23:
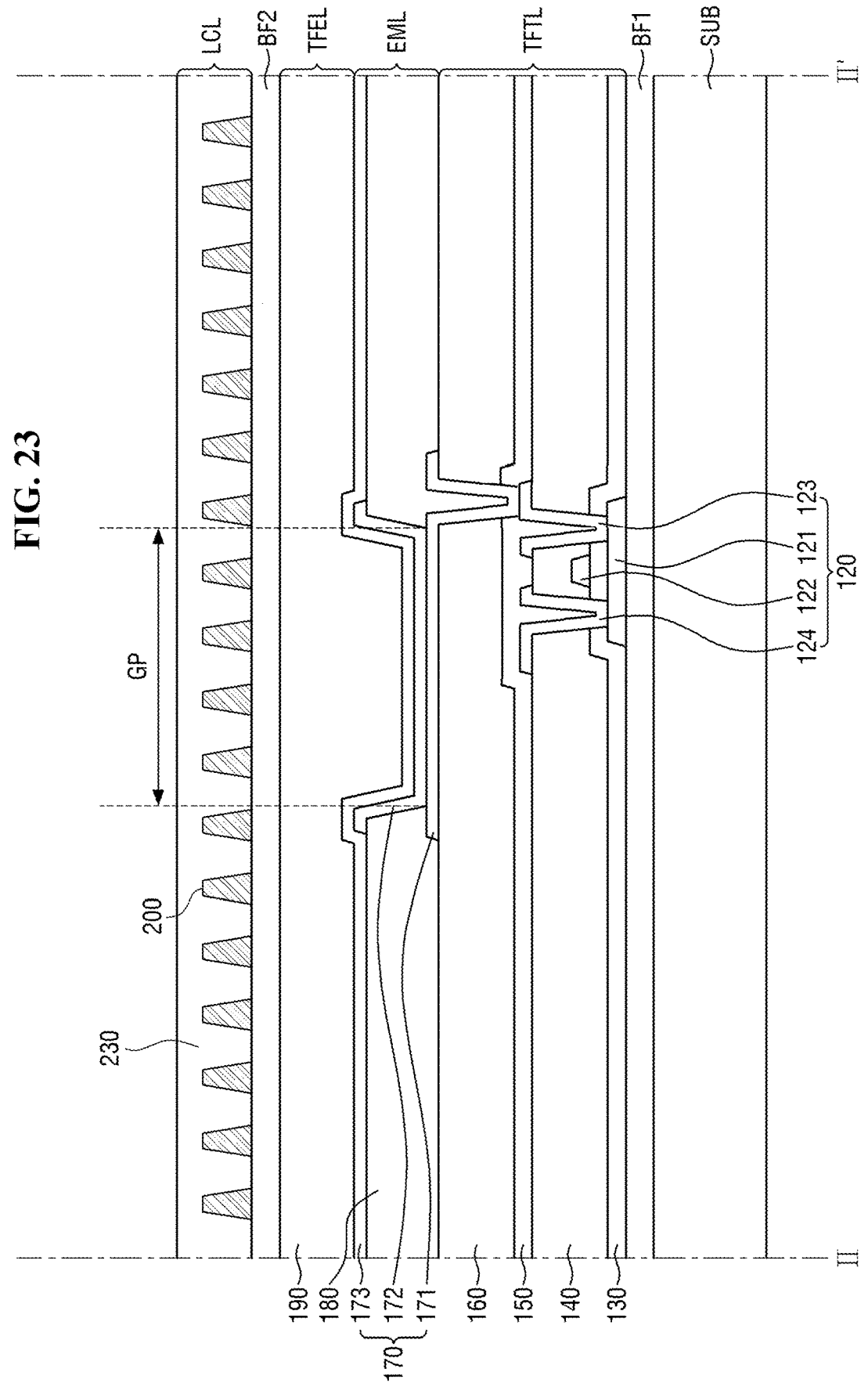
FIG. 23 is a cross-sectional view of the display device including the viewing angle control layer shown in FIG. 22.

FIG. 22 is a cross-sectional view taken along the line I-I' of FIG. 2 according to another embodiment of the present disclosure. FIG. 23 is a cross-sectional view showing an example of the display device including the viewing angle control layer shown in FIG. 22.

The embodiment shown in FIGS. 22 and 23 is different from the embodiment shown in FIGS. 3 and 7 in that the touch insulating layer TINS is omitted.

Referring to FIGS. 22 and 23, a display device 12 may include a substrate SUB, a thin-film transistor layer TFTL disposed on the substrate SUB, an emission material layer EML, a thin-film encapsulation layer TFEL, and a viewing angle control layer LCL in this order. The viewing angle control layer LCL may be disposed on the thin-film encapsulation layer TFEL. For example, the viewing angle control layer LCL may be formed on a second buffer layer BF2 formed on the thin-film encapsulation layer TFEL.

The display device, according to embodiments of the present disclosure, provides privacy protection features by including the viewing angle control patterns that absorbs light traveling toward the sides of the emission material layer.

What is claimed is:

1. A display device comprising:
a display panel having a display area and a non-display area; and
a viewing angle control layer in the display area, the viewing angle control layer comprising a plurality of viewing angle control patterns spaced apart from one another, each of the viewing angle control patterns comprising a transparent insulating pattern and a multi-layer sidewall on a side surface of the transparent insulating pattern,
wherein the multi-layer sidewall comprises a first metal nitride layer, a second metal nitride layer, and a metal layer between the first metal nitride layer and the second metal nitride layer, and
wherein the first metal nitride layer, the second metal nitride layer, and the metal layer each comprises Al or Ti.

2. The display device of claim 1, wherein the first metal nitride layer, the second metal nitride layer, and the metal layer comprise a same metal.

3. The display device of claim 1, wherein the multi-layer sidewall further comprises a metal oxide layer.

4. The display device of claim 3, wherein the first metal nitride layer, the metal layer, the second metal nitride layer, and the metal oxide layer are sequentially stacked on the transparent insulating pattern.

5. The display device of claim 1, wherein a height of the viewing angle control patterns has a same ratio as a distance from a central axis of a first one of the viewing angle control patterns to a center axis of an adjacent second one of the viewing angle control patterns.

6. The display device of claim 1, wherein a thickness of the first metal nitride layer is equal to a thickness of the second metal nitride layer, and
wherein a thickness of the metal layer is greater than the thickness of the first metal nitride layer.

7. The display device of claim 6, wherein the multi-layer sidewall further comprises a metal oxide layer, and
wherein the metal oxide layer is thinner than the first metal nitride layer.

8. The display device of claim 1, wherein the transparent insulating pattern has a cross-sectional shape of an isosceles trapezoid having a longer base side, and
wherein base angles of the isosceles trapezoid are in a range from 60 degrees to 89.5 degrees.

9. The display device of claim 1, wherein the display panel comprises:
a substrate;
an emission material layer on the substrate and comprising a pixel a pixel-defining layer defining the pixel, the pixel comprising a pixel electrode, an emissive layer, and a common electrode; and
a thin-film encapsulation layer on the emission material layer, and
wherein the viewing angle control layer is on the thin-film encapsulation layer.

10. The display device of claim 9, wherein a ratio of a width of the viewing angle control patterns to a width of the emissive layer in a range from 1:3 to 1:4.

11. The display device of claim 10, further comprising a touch sensing layer between the thin-film encapsulation layer and the viewing angle control layer.

12. The display device of claim 11, wherein the touch sensing layer comprises a touch electrode, and
wherein at least a part of the viewing angle control pattern overlaps with the touch electrode.

13. The display device of claim 10, further comprising a touch sensing layer on the viewing angle control layer.

14. A display device comprising:
a display panel having a display area and a non-display area; and
a viewing angle control layer comprising a plurality of viewing angle control patterns spaced apart from one another in the display area,
wherein each of the viewing angle control patterns comprises a transparent insulating pattern and a multi-layered sidewall on a side surface of the transparent insulating pattern,
wherein the multi-layer sidewall comprises a first metal nitride layer, a second metal nitride layer, and a metal layer between the first metal nitride layer and the second metal nitride layer, and
wherein the first metal nitride layer, the metal layer, and the second metal nitride layer are either AlN, Al, AlN, respectively, or TiN, Ti, TiN, respectively.

15. The display device of claim 14, wherein the multi-layer sidewall further comprises a metal oxide layer formed of $Al_2O_3$ or $Ti_2O_3$.

16. The display device of claim 15, wherein a height of the viewing angle control patterns is has a same ratio as a distance from a central axis of a first one of the viewing angle control patterns to a center axis of an adjacent second one of the viewing angle control patterns.

17. The display device of claim 15, wherein the display panel further comprises a plurality of pixels in the display area, wherein the each of the pixel comprises a pixel electrode, an emissive layer, and a common electrode, and wherein a ratio of a width of the pixels to a width of the viewing angle control patterns is in a range from 1:3 to 1:4.

18. A method of fabricating a display device, the method comprising:

forming a plurality of transparent insulating layer patterns spaced apart from one another at a uniform distance on a display panel;

forming a light-absorbing layer by sequentially stacking a first metal nitride layer, a metal layer, and a second metal nitride layer on the display panel and covering the plurality of transparent insulating layer patterns, the first metal nitride layer, the second metal nitride layer, and the metal layer each comprise Al or Ti; and etching the light-absorbing layer on upper surfaces of the plurality of transparent insulating layer patterns and between adjacent ones of the plurality of transparent insulating layer patterns by anisotropic etching.

19. The method of claim 18, wherein the forming of the light-absorbing layer comprises stacking a metal oxide layer on the second metal nitride layer.

20. The method of claim 19, wherein the first metal nitride layer, the metal layer, and the second metal nitride layer are AlN, Al, and AlN, respectively, or TiN, Ti, and TiN, respectively.

21. The method of claim 20, wherein the metal oxide layer is $Al_2O_3$ or $Ti_2O_3$.

* * * * *